United States Patent
Cheon et al.

(10) Patent No.: US 11,672,119 B2
(45) Date of Patent: Jun. 6, 2023

(54) VERTICAL MEMORY DEVICES

(71) Applicant: SAMSUNG ELECTRONICS CO., LTD., Suwon-si (KR)

(72) Inventors: Jisung Cheon, Ansan-si (KR); Jiye Noh, Incheon (KR); Byunggon Park, Seoul (KR); Jinsoo Lim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 252 days.

(21) Appl. No.: 17/028,029

(22) Filed: Sep. 22, 2020

(65) Prior Publication Data

US 2021/0327896 A1    Oct. 21, 2021

(30) Foreign Application Priority Data

Apr. 20, 2020 (KR) ........................ 10-2020-0047395

(51) Int. Cl.
| | |
|---|---|
| *H01L 29/788* | (2006.01) |
| *H01L 27/11582* | (2017.01) |
| *G11C 7/18* | (2006.01) |
| *H01L 23/522* | (2006.01) |
| *H01L 27/11565* | (2017.01) |

(52) U.S. Cl.
CPC .......... *H01L 27/11582* (2013.01); *G11C 7/18* (2013.01); *H01L 23/5226* (2013.01); *H01L 27/11565* (2013.01)

(58) Field of Classification Search
CPC .............. G11C 16/0483; G11C 17/123; G11C 2213/75; H01L 27/11524; H01L 27/11529; H01L 27/11582; H01L 27/11578; H01L 27/11551; H01L 29/7926; H01L 21/28282; H01L 27/11556; H01L 27/11521; H01L 23/5226; H01L 27/11565; H01L 27/11563; H01L 27/1157; H01L 21/76804; H01L 21/76877; H01L 29/792
See application file for complete search history.

(56) References Cited

U.S. PATENT DOCUMENTS

| | | | |
|---|---|---|---|
| 8,120,079 | B2 | 2/2012 | Augusto |
| 8,729,622 | B2 | 5/2014 | Moon et al. |
| 9,698,153 | B2 * | 7/2017 | Liu ...................... H01L 21/8221 |

(Continued)

*Primary Examiner* — Mary A Wilczewski
*Assistant Examiner* — Tsz K Chiu
(74) *Attorney, Agent, or Firm* — Volentine, Whitt & Francos, PLLC

(57) ABSTRACT

A vertical memory device includes a gate electrode structure, channels, a charge storage structure, and a division pattern. The gate electrode includes gate electrodes spaced apart from each other in a first direction. The channel extends through the gate electrode structure, and includes a first portion and a second portion on and contacting the first portion. The second portion includes a lower surface having a width less than that of an upper surface of the first portion. The charge storage structure covers an outer sidewall of the channel. The division pattern extends between the channels in a second direction, and includes a first dummy channel and a first dummy charge storage structure covering a sidewall and a lower surface thereof. The first dummy channel includes the same material as that the channel, and the first dummy charge storage structure includes the same material as the charge storage structure.

20 Claims, 24 Drawing Sheets

(56) References Cited

U.S. PATENT DOCUMENTS

| | | | |
|---|---|---|---|
| 9,853,043 B2 * | 12/2017 | Lu | H01L 21/76802 |
| 9,997,538 B2 | 6/2018 | Son et al. | |
| 10,074,665 B2 | 9/2018 | Kawaguchi et al. | |
| 10,134,752 B2 * | 11/2018 | Kim | H01L 27/11582 |
| 2015/0194435 A1 * | 7/2015 | Lee | H01L 27/11582 |
| | | | 257/329 |
| 2016/0307917 A1 * | 10/2016 | Yada | H01L 29/4966 |
| 2017/0062454 A1 * | 3/2017 | Lu | H01L 21/76877 |
| 2017/0236827 A1 * | 8/2017 | Hirotani | H01L 27/11582 |
| | | | 257/326 |
| 2017/0263638 A1 | 9/2017 | Okada | |
| 2018/0277556 A1 | 9/2018 | Kang | |
| 2019/0378854 A1 | 12/2019 | Lee et al. | |

* cited by examiner

VERTICAL MEMORY DEVICES

CROSS-REFERENCE TO RELATED APPLICATIONS

This application claims priority under 35 USC § 119 to Korean Patent Application No. 10-2020-0047395 filed on Apr. 20, 2020 in the Korean Intellectual Property Office (KIPO), the subject matter of which is hereby incorporated by reference.

BACKGROUND

1. Field

The inventive concept relates generally to semiconductor memory devices. More particularly, the inventive concept relates to vertical memory devices.

2. Description of the Related Art

In certain methods of manufacturing a vertical NAND (or VNAND) flash memory devices, as the number of gate electrodes stacked in a vertical direction increases, a mold layer for forming the gate electrodes may be formed by dividing the mold layer into a lower mold layer and an upper mold layer. In order to form channels extending through the lower and upper mold layers, lower channel holes may be formed through the lower mold layer, and sacrificial patterns may be formed to fill the lower channel holes, respectively. After forming an upper mold layer on the lower mold layer, an SSL cutting hole may be formed through an upper portion of the mold layer to extend in a direction, and a division pattern may be formed to fill the SSL cutting hole. Upper channel holes may be formed through the upper mold layer to expose the sacrificial patterns, respectively, and the exposed sacrificial patterns may be removed. When the exposed sacrificial patterns are removed, a portion of the division pattern may be also removed, and thus neighboring channel holes may be connected with each other. Accordingly, channels and/or charge storage structures in the neighboring channel holes may be connected with each other.

SUMMARY

Embodiments of the inventive concept provide vertical memory devices exhibiting improved performance characteristics.

According to an aspect of the inventive concept, there is provided a vertical memory including; a gate electrode structure on a substrate and including gate electrodes spaced apart in a first direction, channels extending through the gate electrode structure and including a first portion on the substrate, and a second portion contacting the first portion, wherein the second portion includes a lower surface having a width less than a width of an upper surface of the first portion, a charge storage structure covering an outer sidewall of each of the channels, and a division pattern extending between the channels in a second direction, wherein the division pattern includes a first dummy channel, and a first dummy charge storage structure covering a sidewall and a lower surface of the first dummy channel. The first dummy channel includes a material substantially the same as each of the channels, and the first dummy charge storage structure includes a material substantially the same as the charge storage structure.

According to an aspect of the inventive concept, there is provided a vertical memory including; a gate electrode structure on a substrate and including gate electrodes spaced apart in a first direction, channels extending through the gate electrode structure and including a first portion on the substrate and a second portion contacting the first portion, wherein the second portion includes a lower surface having a width less than a width of an upper surface of the first portion, a first dummy channel extending through the gate electrode structure and spaced apart from the channels, wherein the first dummy channel includes a third portion on the substrate and a fourth portion contacting the third portion, wherein the fourth portion includes a lower surface having a width less than a width of an upper surface of the third portion. The first dummy channel includes a material substantially the same as each of the channels, and the first dummy channel includes a protrusion portion protruding in the first direction from a lower surface and a lowermost surface is lower than a lowermost surface of each of the channels.

According to an aspect of the inventive concept, there is provided a vertical memory including; a gate electrode structure on a substrate and including gate electrodes spaced apart in a first direction, channels extending through the gate electrode structure and including a first portion on the substrate and a second portion contacting the first portion, wherein the second portion includes a lower surface having a width less than a width of an upper surface of the first portion, a charge storage structure covering an outer sidewall of each of the channels, a first dummy channel extending through the gate electrode structure and spaced apart from the channels, wherein the first dummy channel includes a third portion on the substrate and a fourth portion contacting the third portion, wherein the fourth portion includes a lower surface having a width less than a width of an upper surface of the third portion, a first dummy charge storage structure covering an outer sidewall of the first dummy channel, a division pattern extending between the channels in a second direction and including a second dummy channel, a second dummy charge storage structure covering a sidewall and a lower surface of the second dummy channel, contact plugs respectively on the channels, and a bit line extending in a third direction and electrically connected to the contact plugs. Each of the first dummy channel and the second dummy channel includes a material substantially the same as the channels. Each of the first dummy charge storage structure and the second dummy charge storage structure includes a material substantially the same as the charge storage structure. The second dummy channel contacts an upper outer sidewall of the first dummy channel, and the second dummy charge storage structure contacts an upper outer sidewall of the first dummy charge storage structure.

BRIEF DESCRIPTION OF THE DRAWINGS

Embodiments of the inventive concept will now be described in some additional detail with reference to the accompanying drawings.

DETAILED DESCRIPTION

Throughout the written description and drawings, like reference numbers and labels denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

For example, hereinafter, a direction substantially perpendicular to a principal, upper surface of a substrate will be referred to as a first direction D1, and two, intersecting directions substantially parallel to the upper surface of the substrate will be referred to as second and third directions D2 and D3, respectively. However, those skilled in the art will recognize that such designations are arbitrary and relative in nature.

As noted above, Figures (FIGS. 1 to 24, inclusive, variously illustrate methods of manufacturing vertical memory devices according to embodiments of the inventive concept.

Figure 1:
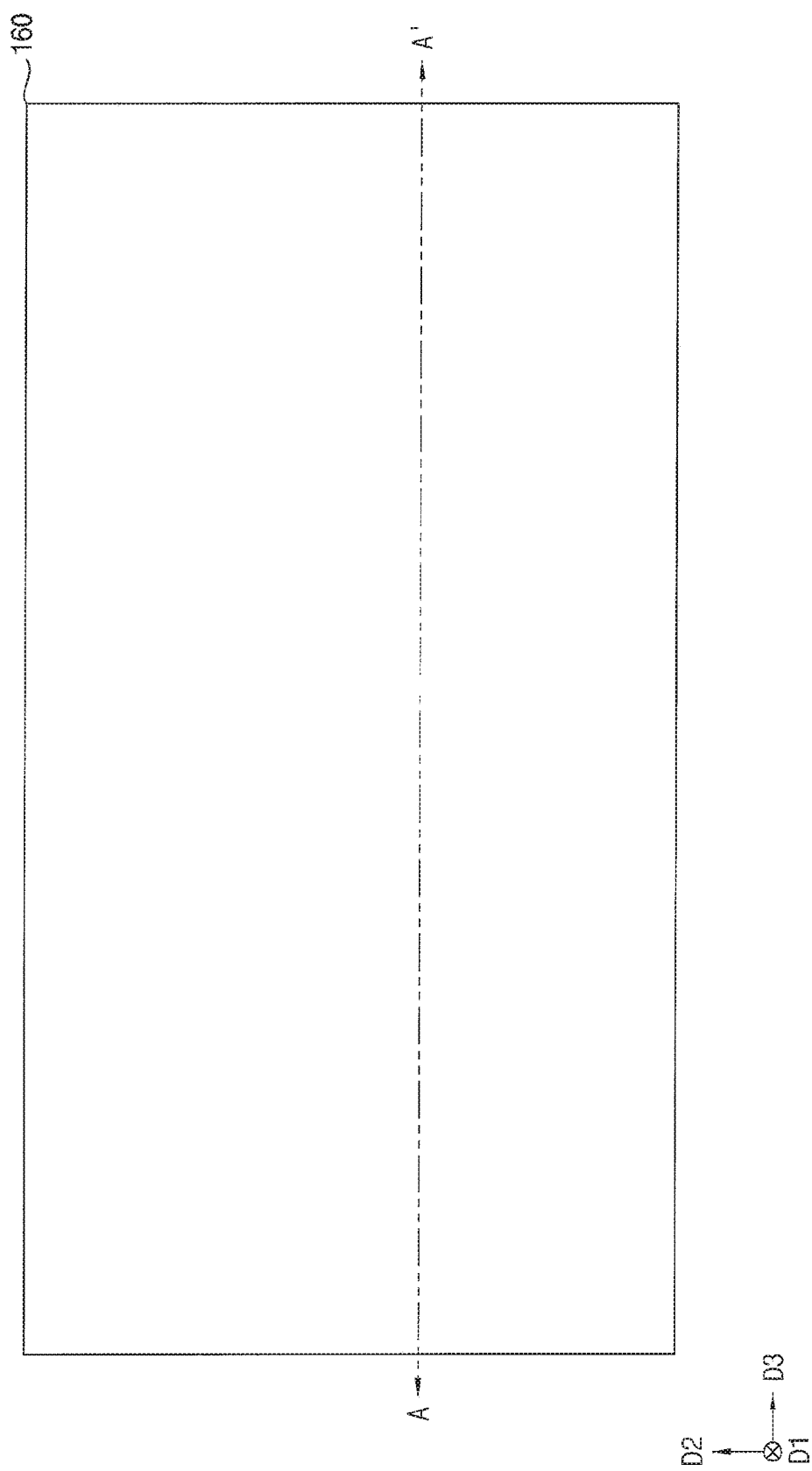
FIGS. 1, 3, 6, 9, 12, 15 and 18 are plan (or top-down) diagrams.
Figure 2:
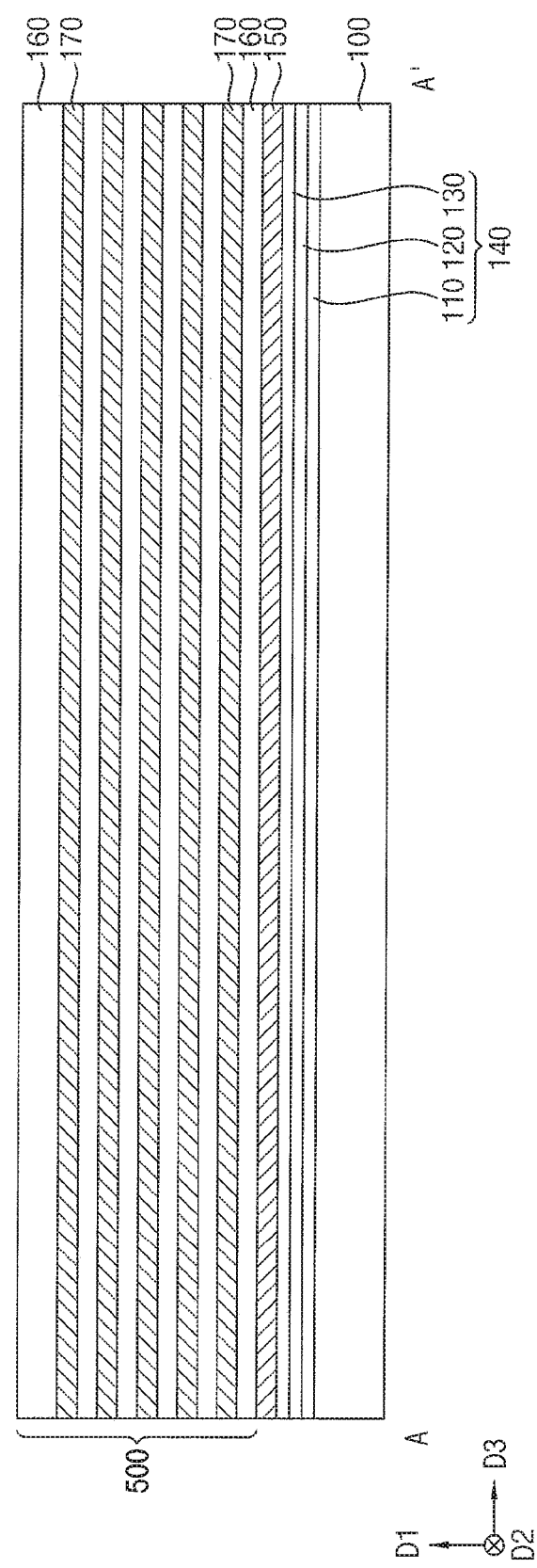
FIGS. 2, 4, 5, 7, 8, 10, 13, 16, and 19-23 are cross-sectional diagrams taken along line A-A'.

Referring to FIGS. 1 and 2, a sacrificial layer structure 140 and a support layer 150 may be formed on a substrate 100. An insulation layer 160 and a fourth sacrificial layer 170 may be alternately and repeatedly formed on the support layer 150 in the first direction D1 to form a first mold layer 500.

The substrate 100 may include silicon, germanium, silicon-germanium or a III-V compound such as GaP, GaAs, GaSb, etc. In some embodiments, the substrate 100 may be a silicon-on-insulator (SOI) substrate or a germanium-on-insulator (GOI) substrate.

The sacrificial layer structure 140 may include first, second and third sacrificial layers 110, 120 and 130 sequentially stacked. The first and third sacrificial layers 110 and 130 may include an oxide, e.g., silicon oxide, and the second sacrificial layer 120 may include a nitride, e.g., silicon nitride. A first recess (not shown) may be formed through the sacrificial layer structure 140 to expose an upper surface of the substrate 100.

The support layer 150 may include a material having an etch selectivity with respect to the first, second and/or third sacrificial layers 110, 120 and 130, e.g., polysilicon doped with N-type impurities. However, the support layer 150 may be formed by depositing an amorphous silicon layer doped with N-type impurities and performing a heat treatment process to include polysilicon doped with N-type impurities.

The support layer 150 may be formed with a constant thickness on the sacrificial layer structure 140 and the upper surface of the substrate 100 exposed by the first recess. A portion of the support layer 150 contacting the upper surface of the substrate 100 in the first recess may be referred to as a support pattern.

The insulation layer 160 may include an oxide, e.g., silicon oxide, and the fourth sacrificial layer 170 may include a material having an etch selectivity with respect to the insulation layer 160, e.g., a nitride such as silicon nitride.

FIG. 2 shows that the first mold layer 500 includes the insulation layers 160 at six (6) levels, respectively, and the fourth sacrificial layers 170 at five (5) levels, respectively. However, the inventive concept is not limited thereto. An uppermost insulation layer 160 among the insulation layers 160 may have a thickness greater than the other insulation layers 160.

Figure 3:
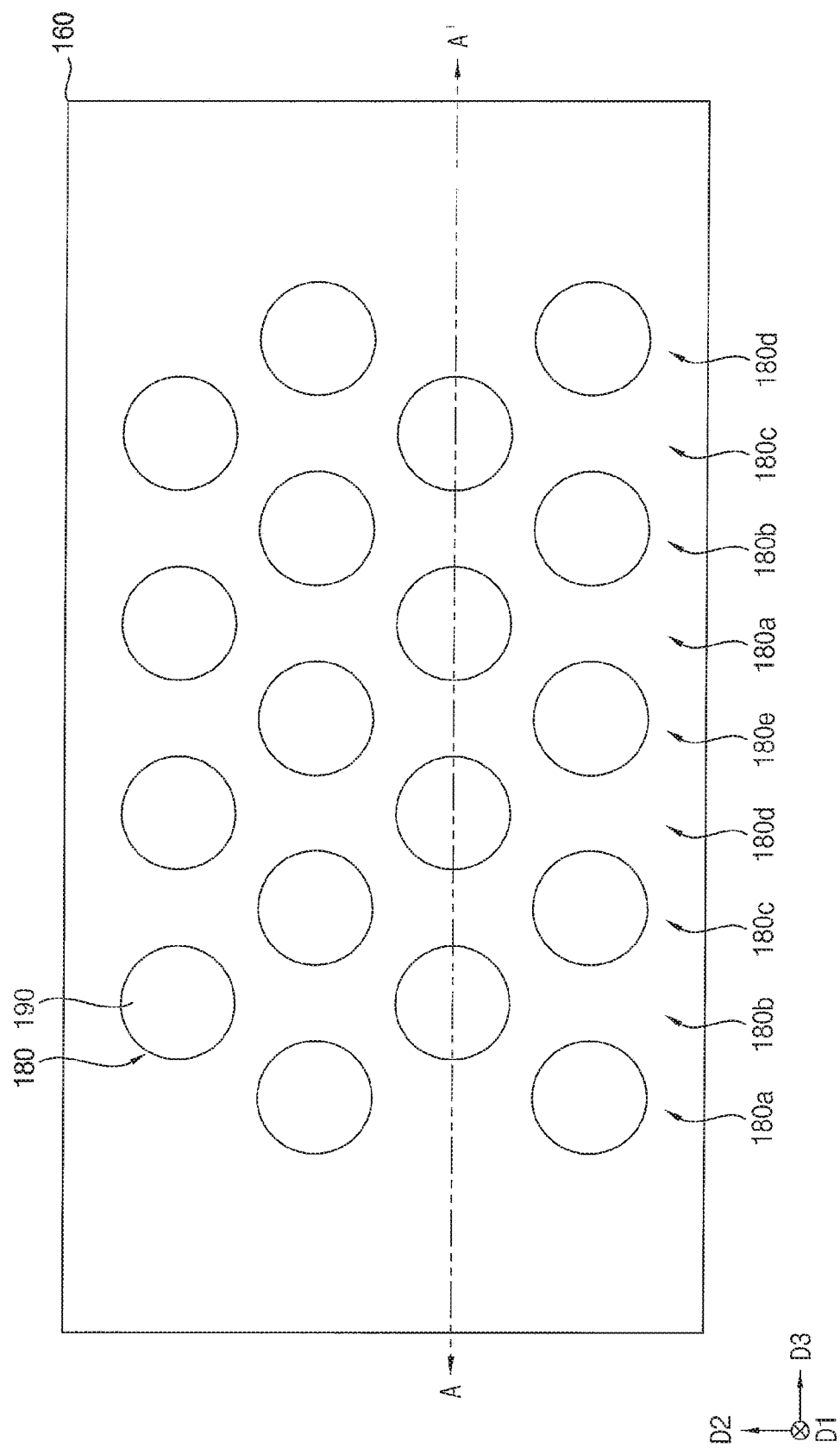
Figure 4:
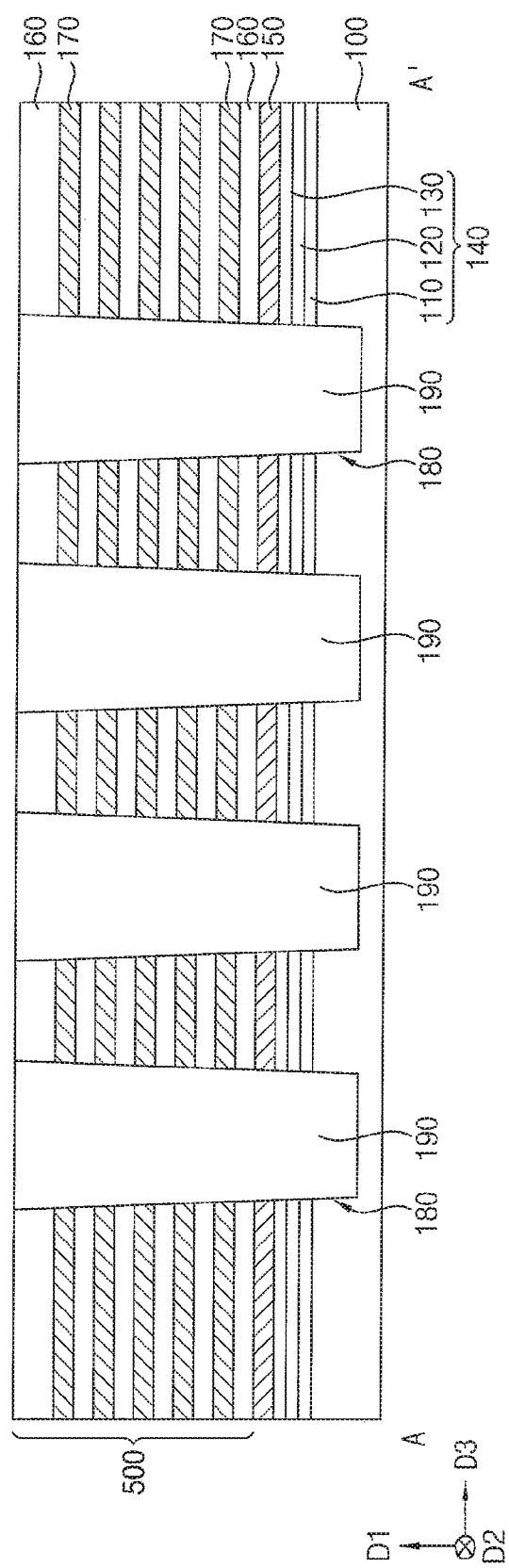

Referring to FIGS. 3 and 4, a lower channel hole 180 may be formed through the first mold layer 500, the support layer 150 and the sacrificial layer structure 140 to expose an upper surface of the substrate 100, and a fifth sacrificial pattern 190 may be formed to fill the lower channel hole 180.

For example, a photoresist pattern (not shown) may be formed on the uppermost one of the insulation layers 160 of the first mold layer 500, and the insulation layers 160 and the fourth sacrificial layers 170 of the first mold layer 500, the support layer 150 and the sacrificial layer structure 140 may be etched using the photoresist pattern as an etching mask to form the lower channel hole 180 exposing the upper surface of the substrate 100. In example embodiments, lower channel holes 180 may be formed in each of the second and third directions D2 and D3, thereby forming a lower channel hole array.

In example embodiments, the lower channel hole array may have a first lower channel hole column 180a including the lower channel holes 180 arranged in the second direction D2, and a second lower channel hole column 180b including the lower channel holes 180 arranged in the second direction D2 and spaced apart from the first lower channel hole column 180a in the third direction D3. The lower channel holes 180 of the second lower channel hole column 180b may be located at an acute angel from the lower channel holes 180 of the first lower channel hole column 180a in the second direction D2 or in the third direction D3.

The first and second lower channel hole columns 180a and 180b may be alternately and repeatedly arranged in the third direction D3. In example embodiments, Five (5) first lower channel hole columns 180a and four (4) second lower channel hole columns 180b may be alternately arranged in the third direction D3 to form a lower channel hole block.

In this particular example, the four (4) lower channel hole columns in the lower channel hole block may be referred to as first, second, third and fourth lower channel hole columns 180a, 180b, 180c and 180d, respectively, and may be arranged in the third direction D3. A central lower channel hole column in the lower channel hole block may be referred to as a fifth lower channel hole column 180e, and another four (4) lower channel hole columns in the lower channel hole block may be referred to as the first, second, third and fourth lower channel hole columns 180a, 180b, 180c and 180d, respectively, and may again be arranged in the third direction D3.

In example embodiments, due to the characteristics of the etching process, each of the lower channel holes 180 may have a width that gradually decreases from top to bottom.

A fifth sacrificial layer may be formed on the uppermost one of the insulation layers 160 and the substrate 100 to fill the lower channel holes 180. Thereafter, the fifth sacrificial layer may be planarized until an upper surface of the uppermost one of the insulation layers 160 is exposed to form a fifth sacrificial pattern 190 in each of the lower channel holes 180. The fifth sacrificial pattern 190 may include a material having an etch selectivity with respect to the insulation layer 160 and the fourth sacrificial layer 170, e.g., polysilicon.

Figure 5:
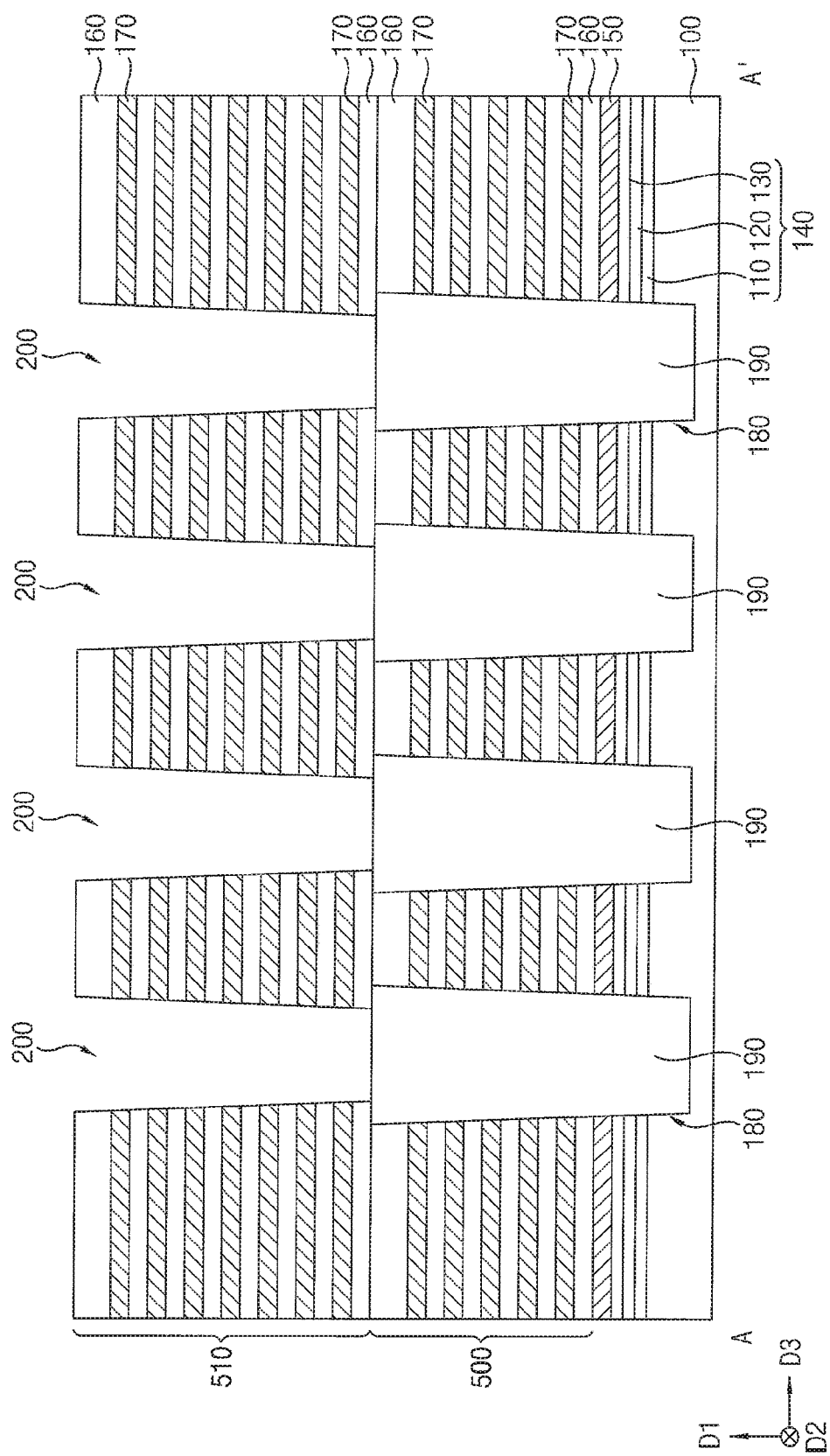

Referring to FIG. 5, the insulation layer 160 and the fourth sacrificial layer 170 may be alternately and repeatedly stacked in the first direction D1 on the first mold layer 500 and the fifth sacrificial patterns 190 to form a second mold layer 510.

In the illustrated example of FIG. 5, the second mold layer 510 includes the insulation layers 160 at eight (8) levels, respectively, and the fourth sacrificial layers 170 at seven (7) levels, respectively. However, the inventive concept is not limited thereto. An uppermost one of the insulation layers 160 may have a thickness greater than any one of the other insulation layers 160 at lower levels within the second mold layer 510.

An upper channel hole 200 may be formed through the second mold layer 510 to expose an upper surface of the fifth sacrificial pattern 190.

For example, a photoresist pattern (not shown) may be formed on the uppermost one of the insulation layers 160 of the second mold layer 510, and the insulation layers 160. Thereafter, the fourth sacrificial layers 170 of the second mold layer 510 may be etched using the photoresist pattern as an etching mask to form the upper channel hole 200 exposing the upper surface of the fifth sacrificial pattern 190. As the lower channel holes 180 are formed in each of the second and third directions D2 and D3, upper channel holes 200 may be also formed in each of the second and third directions D2 and D3, thereby forming an upper channel hole array.

In example embodiments, due to the characteristics of the etching process, each of the upper channel holes 200 may have a width that gradually decreases from top to bottom. Additionally, a width of a lower surface of each of the upper channel holes 200 may be lower than an upper surface of a corresponding one of the lower channel holes 180, that is, an upper surface of a corresponding one of the fifth sacrificial patterns 190.

Figure 6:
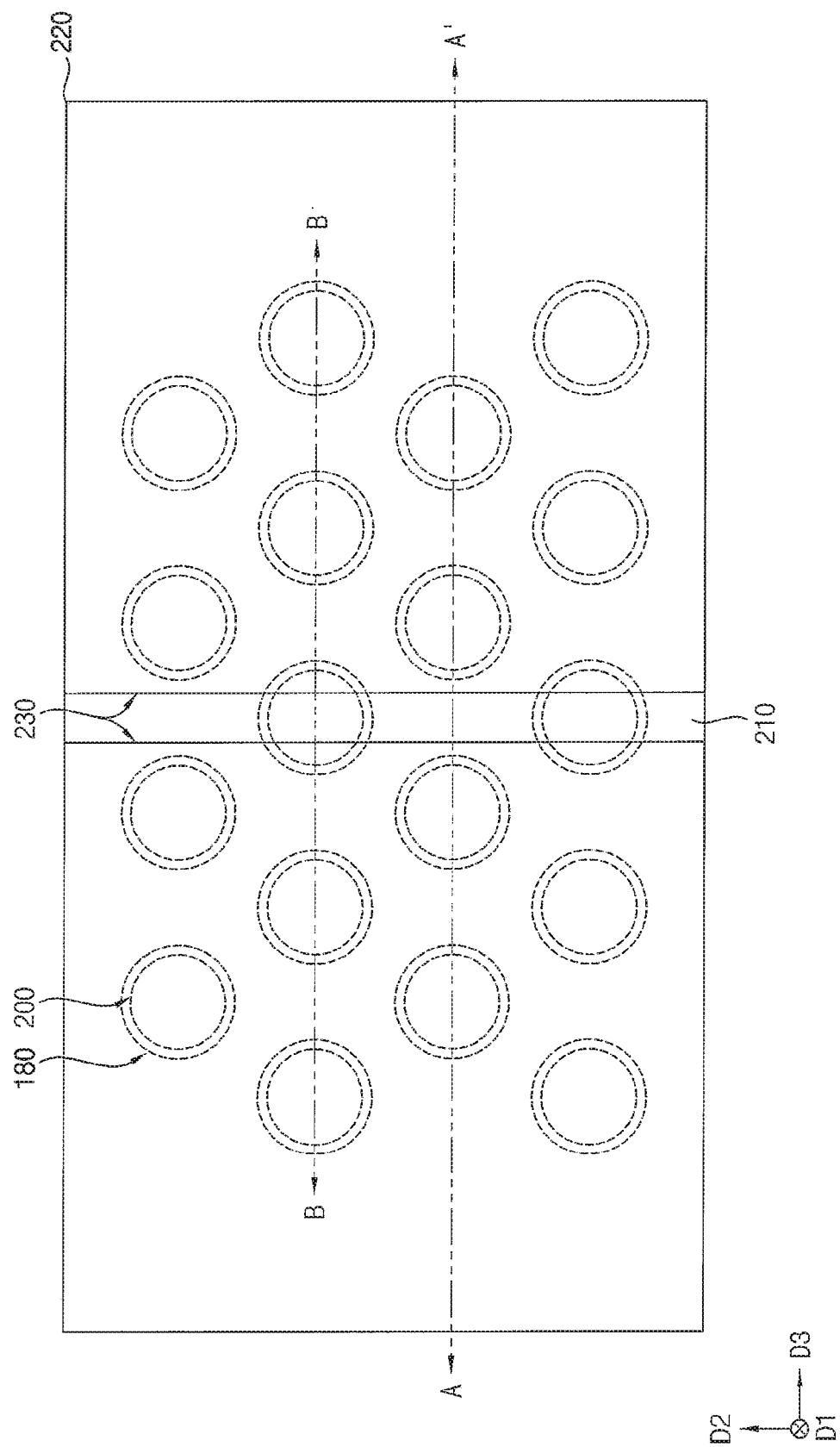
Figure 7:
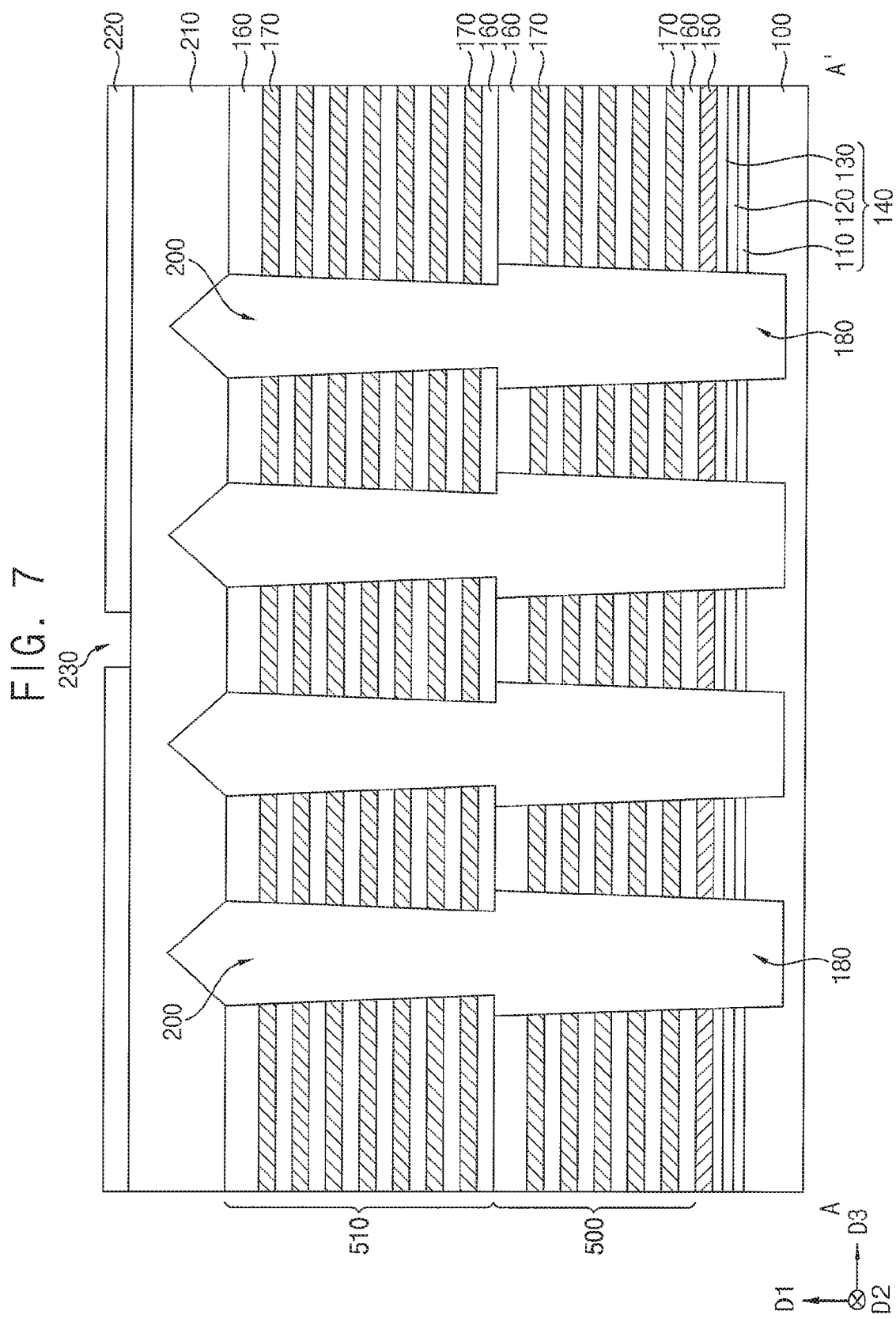
Figure 8:
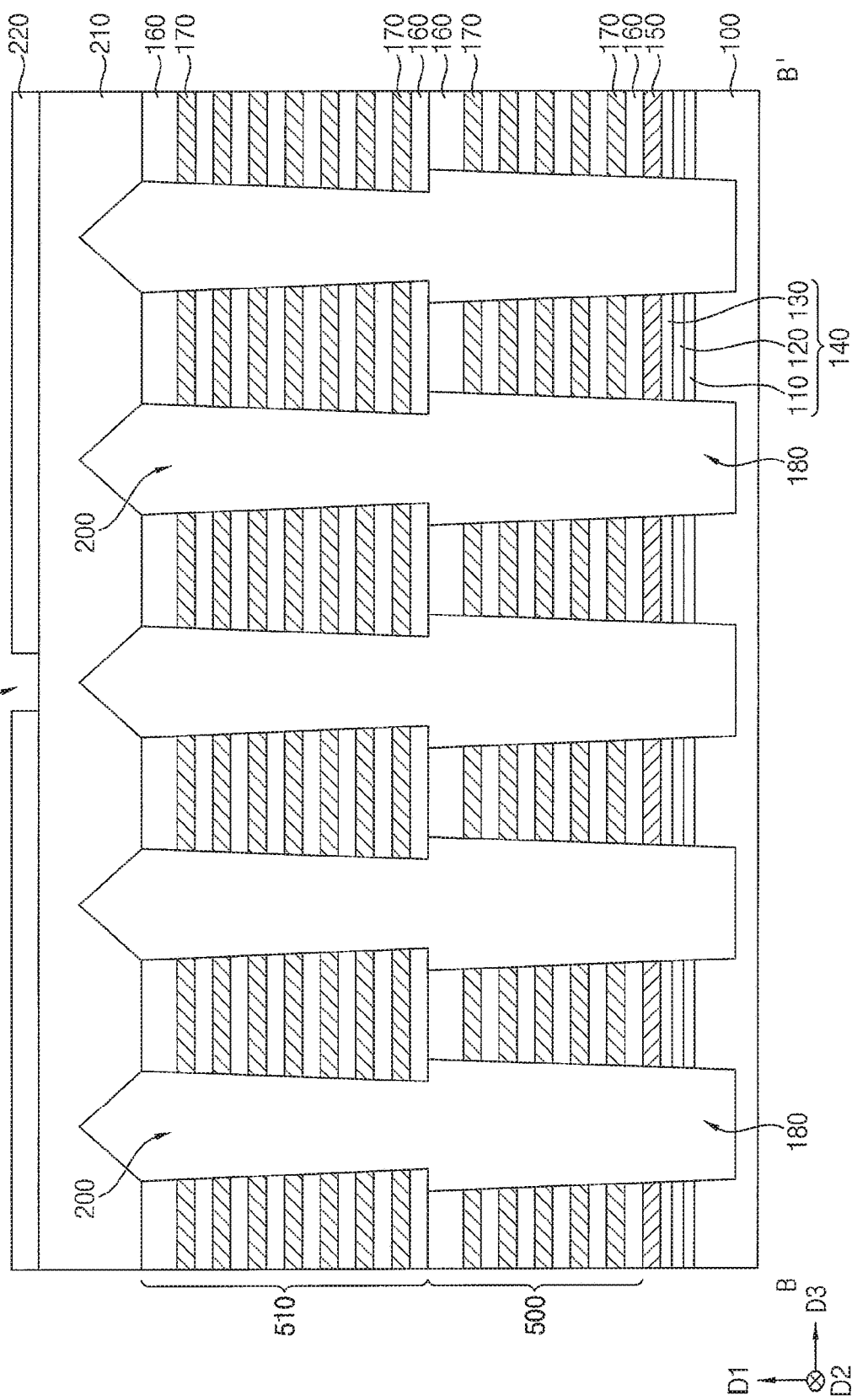

Referring to FIGS. 6, 7 and 8, the fifth sacrificial patterns 190 exposed by the upper channel holes 200 may be removed by, e.g., a wet etching process so that the lower channel holes 180 may again be exposed.

A sixth sacrificial layer 210 and an etch mask layer may be sequentially formed on the second mold layer 510. For example, a photoresist pattern (not shown) may be formed on the etching mask layer, and the etching mask layer may be patterned using the photoresist pattern to form an etching mask 220.

In example embodiments, the sixth sacrificial layer 210 may include an insulation material having a low gap-filling characteristic or a low step coverage, e.g., amorphous carbon layer (ACL). Thus, the lower and upper channel holes 180 and 200 may not be filled with the sixth sacrificial layer 210, and a space connected to the upper channel hole 180 may be formed on the upper channel hole 180. Hereinafter, the lower and upper channel holes 180 and 200 as well as this space may collectively be referred to as a first gap.

In example embodiments, sidewall surfaces of an upper portion of the first gap above the uppermost one of the insulation layers 160 of the second mold layer 510 may be angled (or slanted) with respect to the upper surface of the substrate 100. In certain embodiments, the upper portion of the first gap may have, e.g., a conic shape.

In example embodiments, the etching mask 220 may include a first opening 230 extending in the second direction D2 and exposing an upper surface of the sixth sacrificial layer 210. Here, the first opening 230 may overlap in the first direction D1 at least one of the upper channel holes 200 arranged in the second direction D2. In this regard, the photoresist pattern used to form the first opening 230 in the etching mask 220 may not be aligned with the lower channel holes 180, but may be aligned with the upper channel holes 200. Thus, the possibility of misalignment by the first opening 230 may be reduced.

Figure 9:
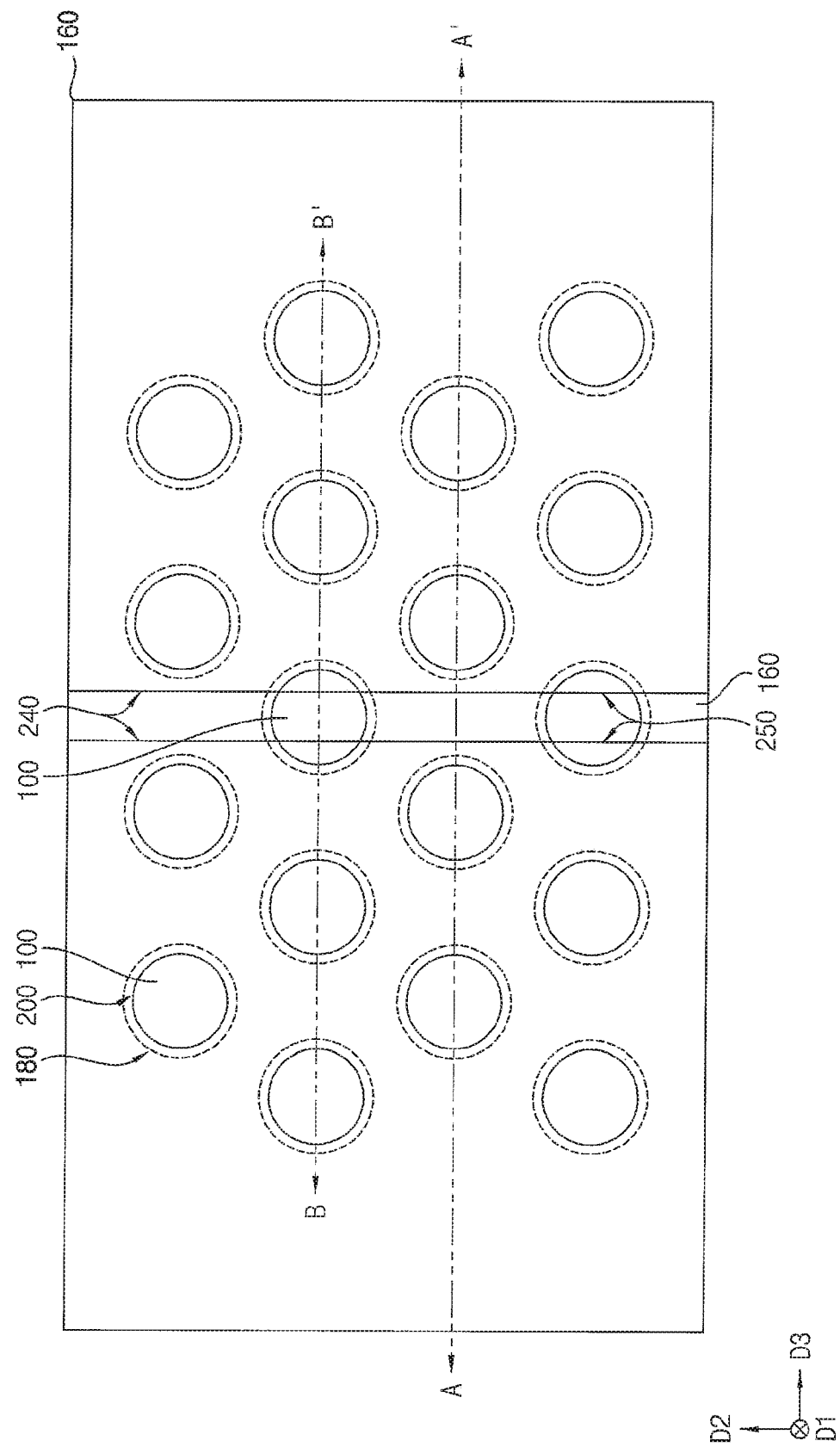
Figure 10:
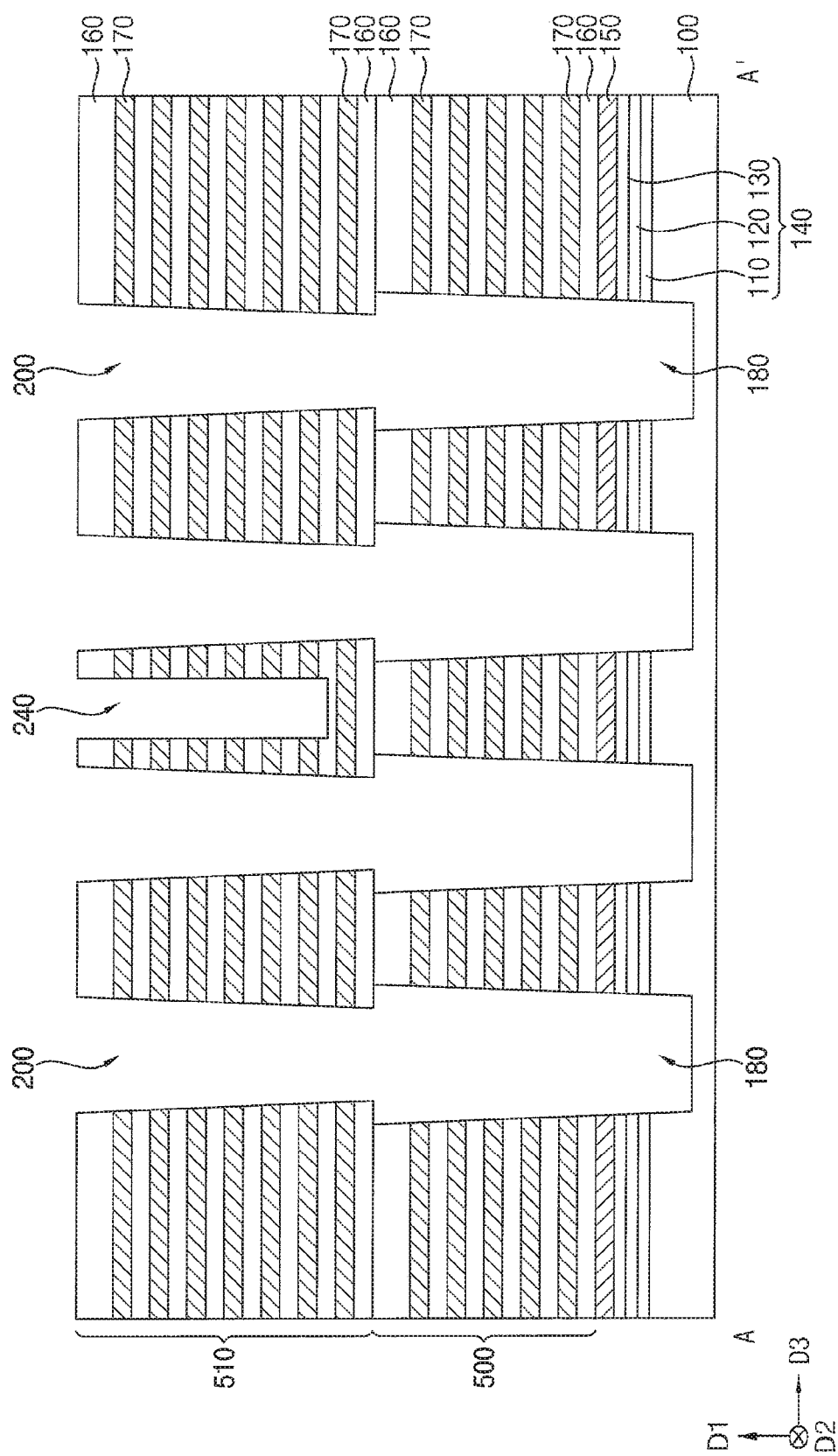
Figure 11:
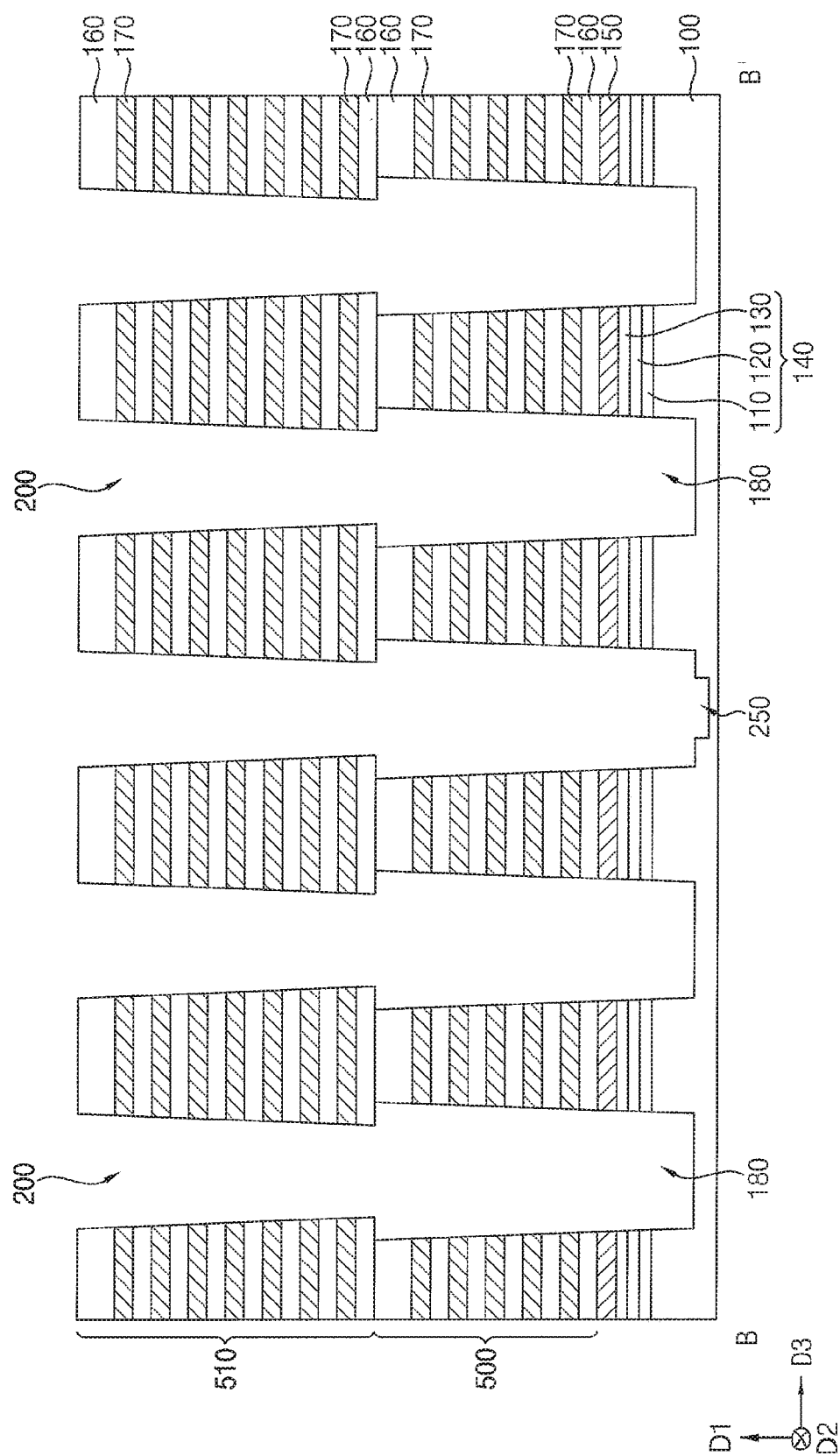
FIGS. 11, 14, 17 and 24 are cross-sectional diagrams taken along line B-B'.

Referring to FIGS. 9, 10 and 11, the sixth sacrificial layer 210 may be etched by an etching process using the etching mask 220 to form a sixth sacrificial pattern (not shown). Upper ones of the insulation layers 160 and the fourth sacrificial layers 170 of the second mold layer 510 may be etched using the sixth sacrificial pattern as an etching mask to form a second opening 240.

In example embodiments, respective second openings 240 may extend in the second direction D2 and be spaced apart from each other in the third direction D3. The second opening 240 may have a width in the third direction D3 that is less than that of the first gap including the lower and upper channel holes 180 and 200, and may be connected to some ones of the first gaps arranged in the second direction D2.

During the formation of the second opening 240, the insulation layers 160 and the fourth sacrificial layers 170 of the second mold layer 510 may be etched at an area where the first gap is not formed. However, the insulation layers 160 and the fourth sacrificial layers 170 are not formed at an area where the first gap is formed, and thus an upper portion of the substrate 100 may be etched to form a second recess 250. A width in the third direction D3 of the second recess 250 may be less than a width in the third direction D3 of the lower channel hole 180.

FIG. 10 shows the insulation layers 160 at upper seven levels, respectively, and the fourth sacrificial layers 170 at upper six levels, respectively, of the second mole layer 510 are etched to form the second opening 240. However, the inventive concept is not limited thereto. FIG. 10 shows a bottom of the second opening 240 above an upper surface of the underlying fourth sacrificial layer 170, such that the upper surface of the underlying fourth sacrificial layer 170 is not exposed. However, the inventive concept is not limited thereto, and the bottom of the second opening 240 may expose a portion of the upper surface of the underlying fourth sacrificial layer 170.

When the sixth sacrificial layer 210 is transformed into the sixth sacrificial pattern, the etching mask 220 may be removed, and when the second opening 240 is formed, the sixth sacrificial pattern may be partially removed. The remaining sixth sacrificial pattern may be further removed by, e.g., an ashing process and/or a stripping process. Thus, the lower and upper channel holes 180 and 200 may again be exposed.

Figure 12:
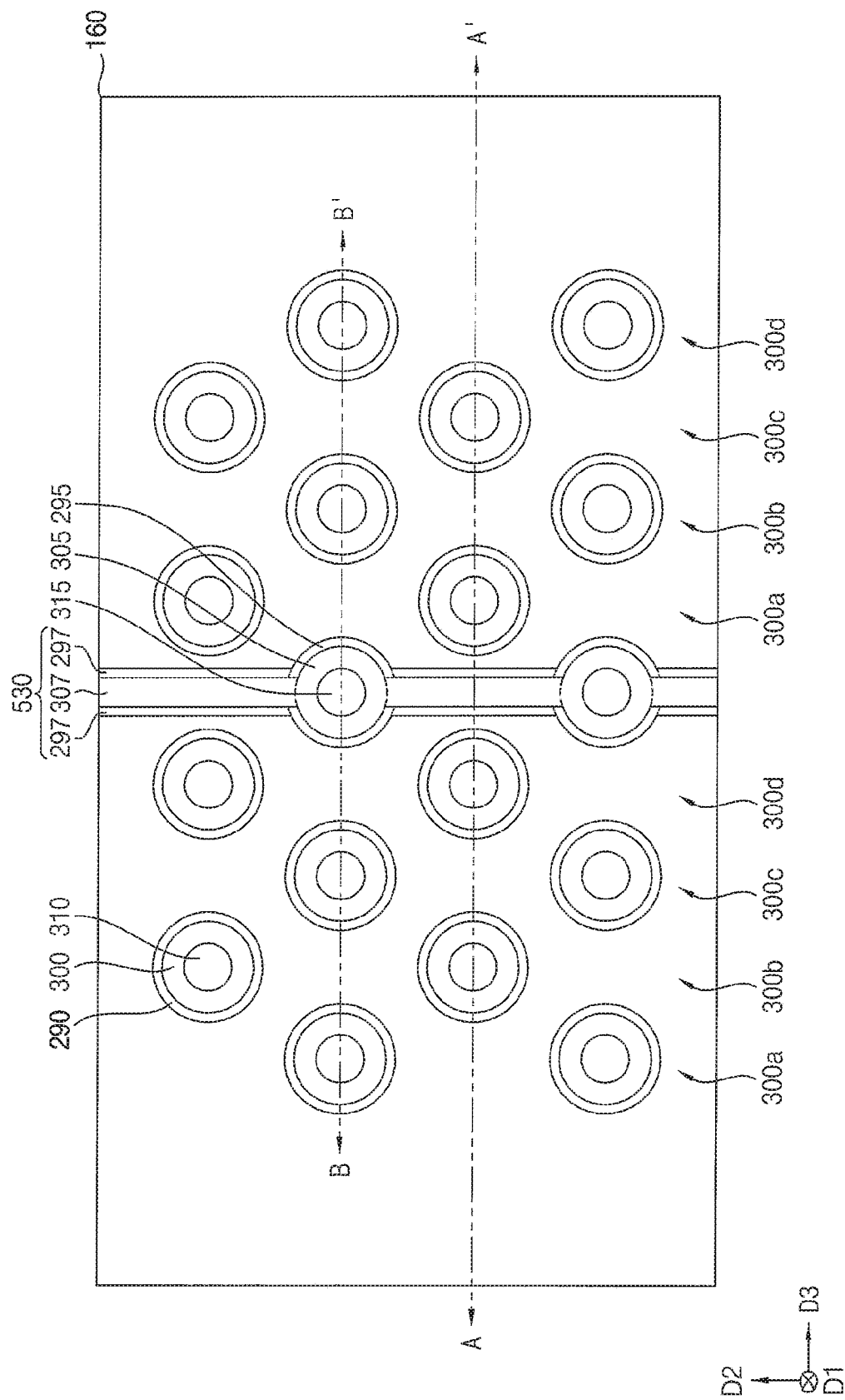
Figure 13:
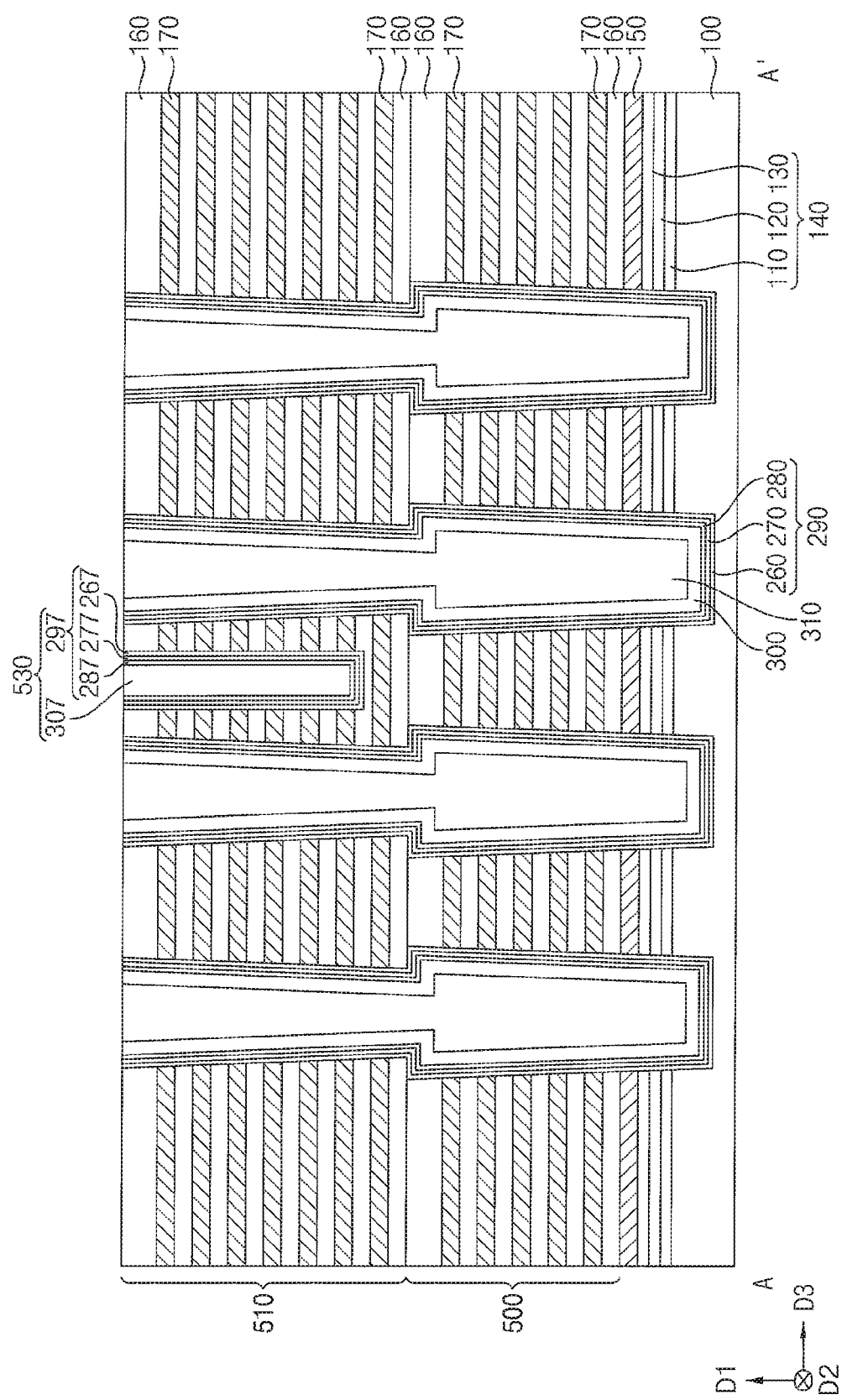
Figure 14:
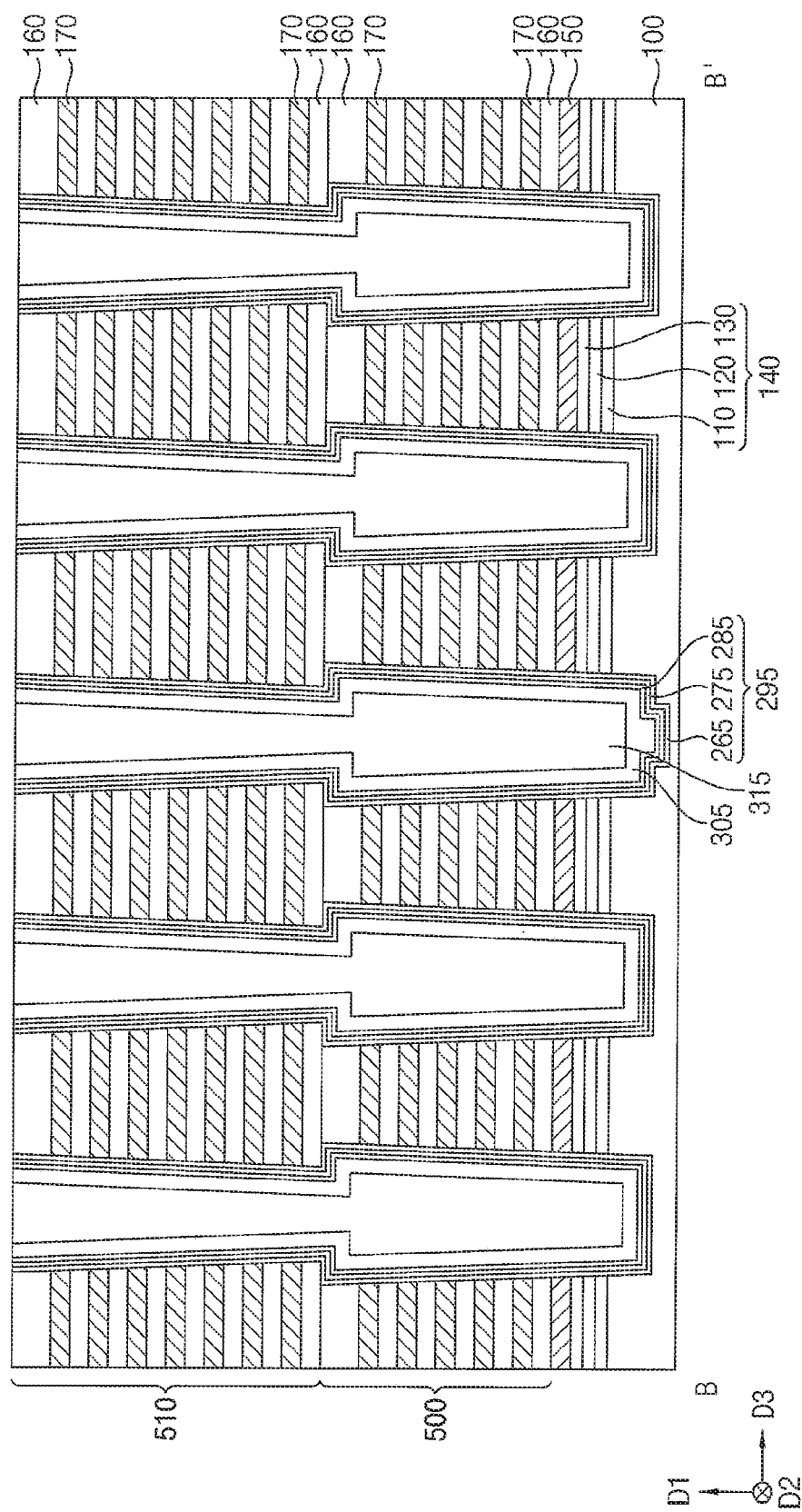

Referring to FIGS. 12, 13 and 14, a charge storage structure layer may be formed on sidewalls of the lower and upper channel holes 180 and 200, the upper surface of the substrate 100 exposed by the lower channel hole 180 and the second recess 250, a sidewall of the second opening 240, a portion of the insulation layer 160 exposed by the second opening 240, and the uppermost one of the insulation layers 160 of the second mold layer 510. Thereafter, a channel layer may be formed on the charge storage structure layer, and a filling layer may be formed on the channel layer to fill the lower and upper channel holes 180 and 200.

Here, the channel layer may include, e.g., polysilicon, and the filling layer may include an oxide, e.g., silicon oxide. The charge storage structure layer may include a first blocking layer, a charge storage layer and a tunnel insulation layer sequentially stacked. The first blocking layer and the tunnel insulation layer may include an oxide, e.g., silicon oxide, and the charge storage layer may include a nitride, e.g., silicon nitride.

The second opening 240 may have the width in the third direction D3 that is less than that of both the lower and upper channel holes 180 and 200, and thus may be entirely filled with the channel layer and the filling layer may not be formed in the second opening 240. The filling layer, the channel layer and the charge storage structure layer may be planarized until the upper surface of the uppermost one of the insulation layers 160 is exposed.

Accordingly, a charge storage structure 290, a channel 300 and a first filling pattern 310 may be sequentially stacked in the lower and upper channel holes 180 and 200 not connected with the second opening 240. A first dummy charge storage structure 295, a first dummy channel 305 and a second filling pattern 315 may be sequentially stacked in the lower and upper channel holes 180 and 200 connected with the second opening 240. A second dummy charge storage structure 297 and a second dummy channel 307 may be sequentially stacked in the second opening 240. The second dummy charge storage structure 297 and the second dummy channel 307 may form a first division pattern 530.

The charge storage structure 290 may include a first blocking pattern 260, a charge storage pattern 270 and a tunnel insulation pattern 280 sequentially stacked on the sidewalls of the lower and upper channel holes 180 and 200 and the upper surface of the substrate 100. The first dummy charge storage structure 295 may include a first dummy blocking pattern 265, a first dummy charge storage pattern 275 and a first dummy tunnel insulation pattern 285 sequentially stacked on the sidewalls of the lower and upper channel holes 180 and 200. The second dummy charge storage structure 297 may include a second dummy blocking pattern 267, a second dummy charge storage pattern 277 and a second dummy tunnel insulation pattern 287 on the sidewall of the second opening 240 and the upper surface of the insulation layer 160.

In example embodiments, the first filling pattern 310 may have a pillar shape extending in the first direction D1, the channel 300 may have a cup-like shape covering a sidewall and a bottom of the first filling pattern 310, and the charge storage structure 290 may have a cup-like shape covering an outer sidewall and a bottom of the channel 300.

In example embodiments, the second filling pattern 315 may have a pillar shape extending in the first direction D1, the first dummy channel 305 may have a cup-like shape covering a sidewall and a bottom of the second filling pattern 315, and the first dummy charge storage structure 295 may have a cup-like shape covering an outer sidewall and a bottom of the first dummy channel 305.

In example embodiments, the second dummy channels 307 may extend in the second direction D2 between neighboring ones of the first dummy channels 305 arranged in the second direction D2 to contact upper outer sidewalls in the second direction D2 of the neighboring ones of the first dummy channels 305. The second dummy charge storage structure 297 may have a cup-like shape covering outer sidewalls in the third direction D3 and a bottom of the second dummy channel 307.

As illustrated above, the lower channel hole array and the upper channel hole array may be defined, and thus the channels 300 and the first dummy channels 305 in the lower and upper channel holes 180 and 200 may also define a channel array and a first dummy channel array, respectively. That is, in certain embodiments, the channels 300 may be formed in the lower channel hole array including the first to fourth lower channel hole columns 180a, 180b, 180c and 180d and in the corresponding upper channel hole array, so as to define a channel array. The first dummy channels 305 may be formed in the lower channel hole array including the fifth lower channel hole column 180e and in the corresponding upper channel hole array, so as to define a first dummy channel array.

Accordingly, the channel array may include a first channel column 300a including the channels 300 arranged in the second direction D2, and a second channel column 300b including the channels 300 arranged in the second direction D2 and being spaced apart from the first channel column 300a, and the first and second channel columns 300a and 300b may be alternately and repeatedly arranged in the third direction D3. The first dummy channel array may include the first dummy channels 305 arranged in the second direction D2 between the first and second channel columns 300a and 300b spaced apart from each other in the third direction D3.

In the foregoing examples, the first dummy channels 305 are disposed between channel groups, each of which may include two first channel columns 300a and two second channel columns 300b, which may form one channel block. However, the inventive concept is not limited thereto.

Figure 15:
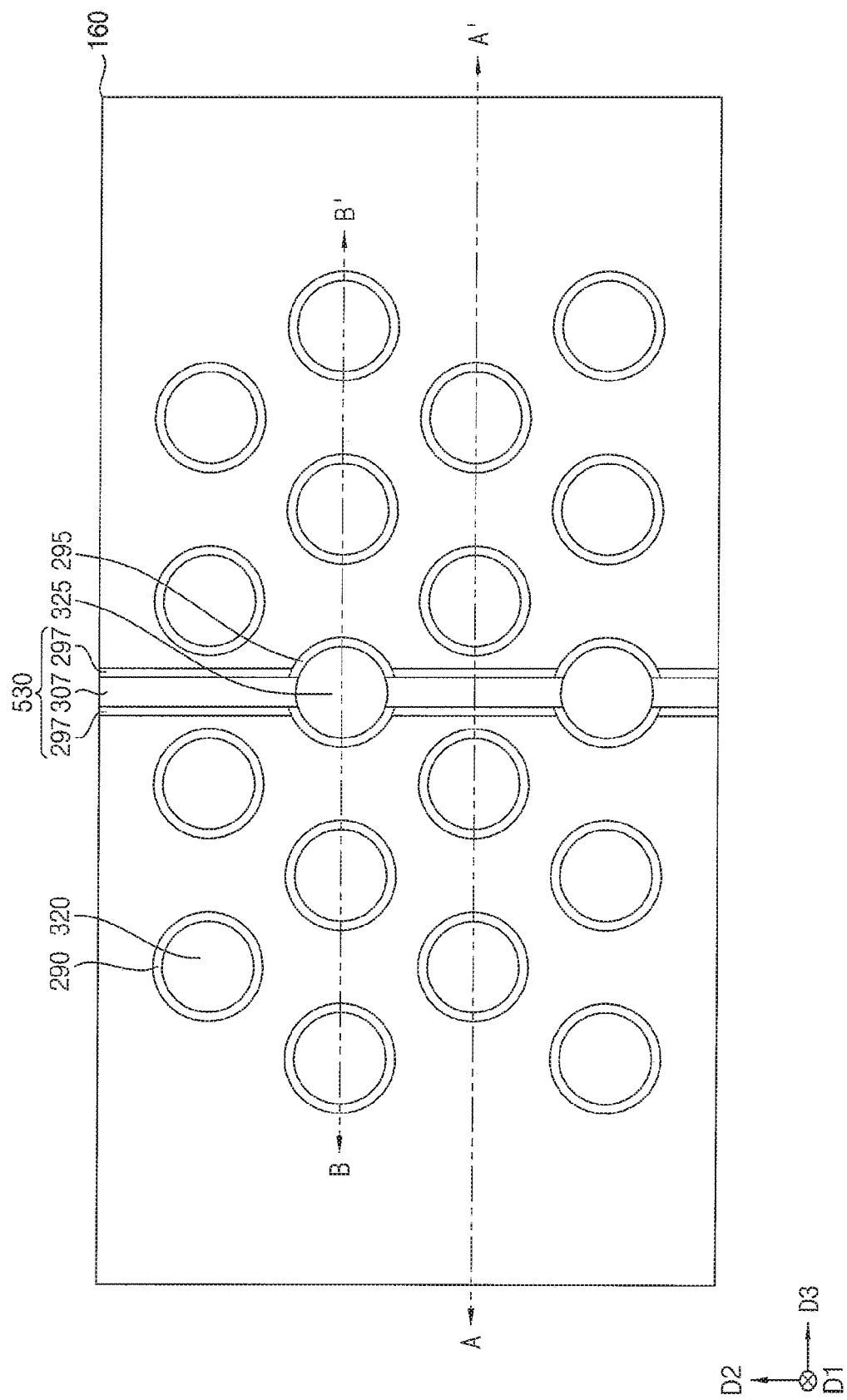
Figure 16:
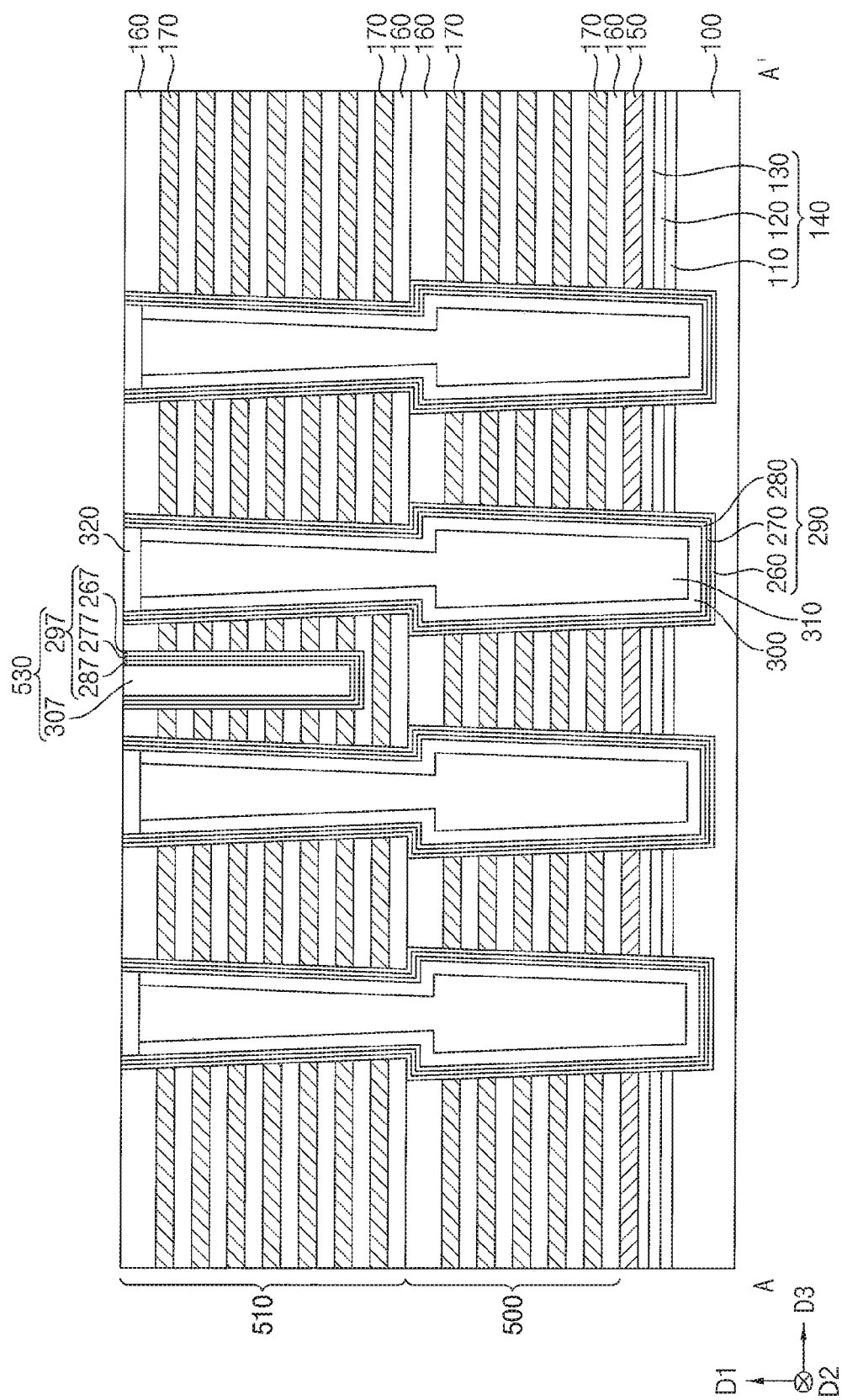
Figure 17:
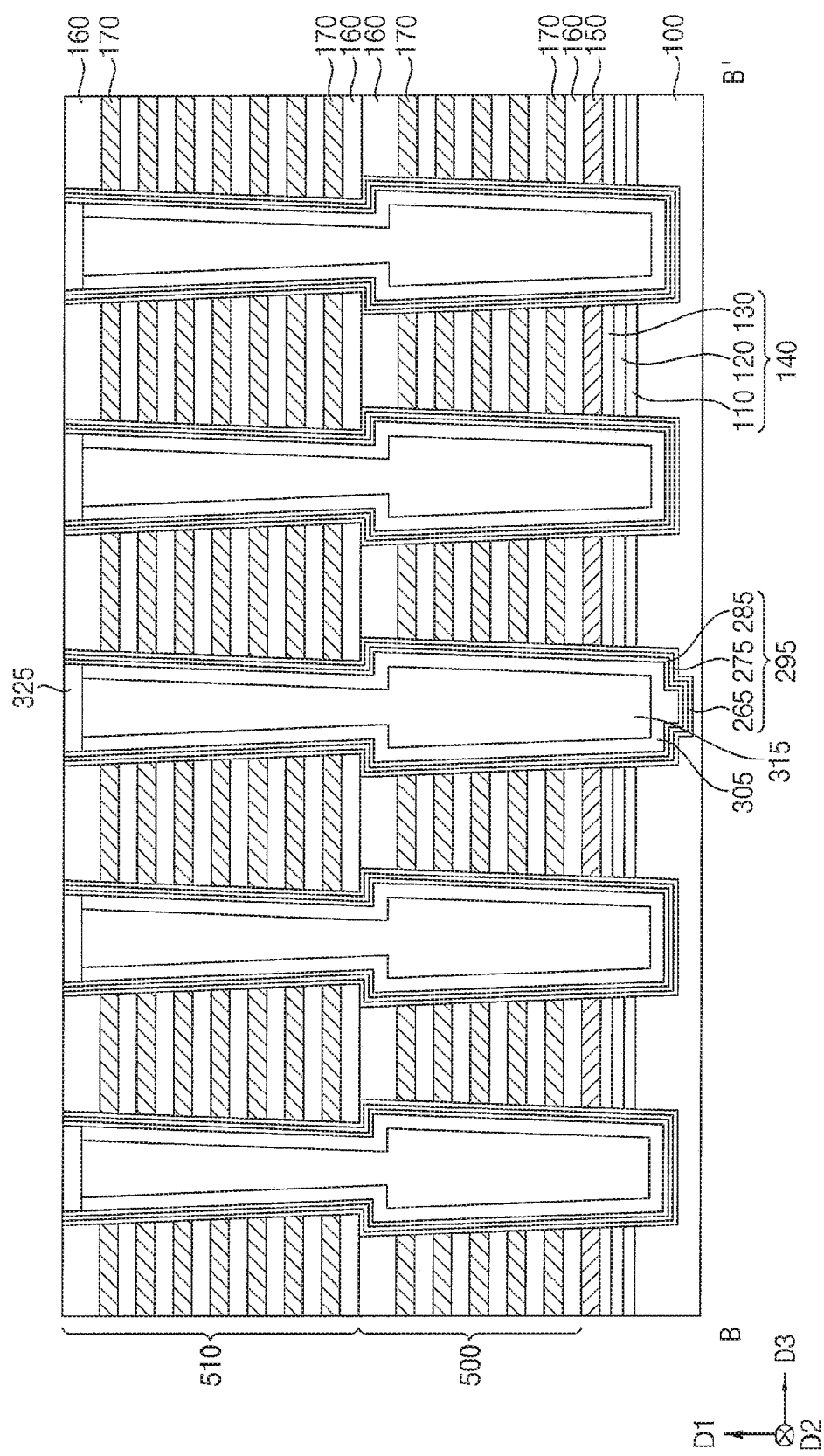

Referring to FIGS. 15, 16 and 17, upper portions of the channel 300, the first dummy channel 305 and the first and second filling patterns 310 and 315 may be removed to form a trench, and first and second pads 320 and 325 may be formed to fill the trench.

The first pad 320 may be formed on the channel 300 and the first filling pattern 310 to be electrically connected to the channel 300, and the second pad 325 may be formed between the first dummy channel 305 and the second filling pattern 315.

In example embodiments, the first and second pads 320 and 325 may include polysilicon doped with impurities or amorphous silicon doped with impurities, and if the first and second pads 320 and 325 include amorphous silicon doped with impurities, a crystallization process may be further performed.

Figure 18:
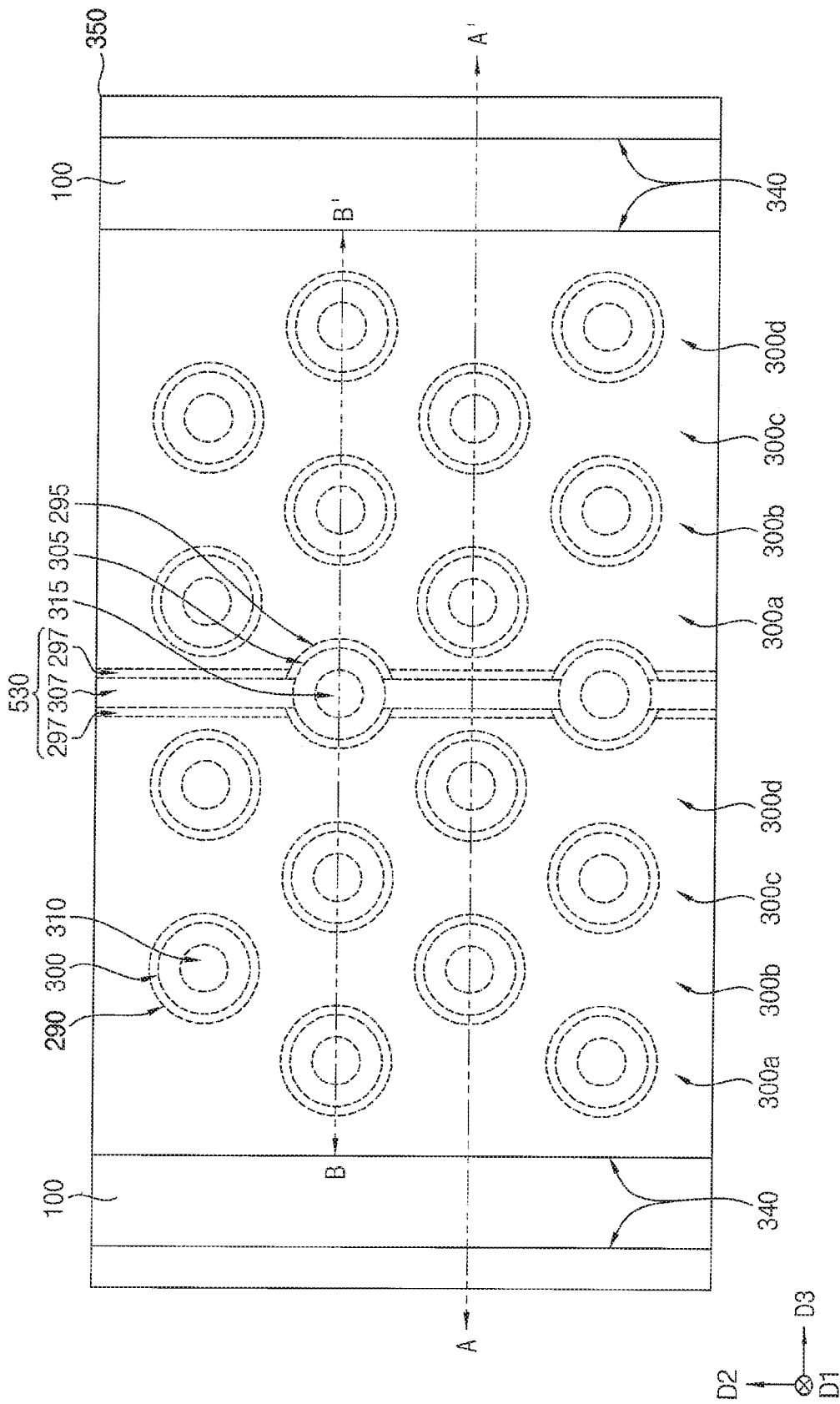
Figure 19:
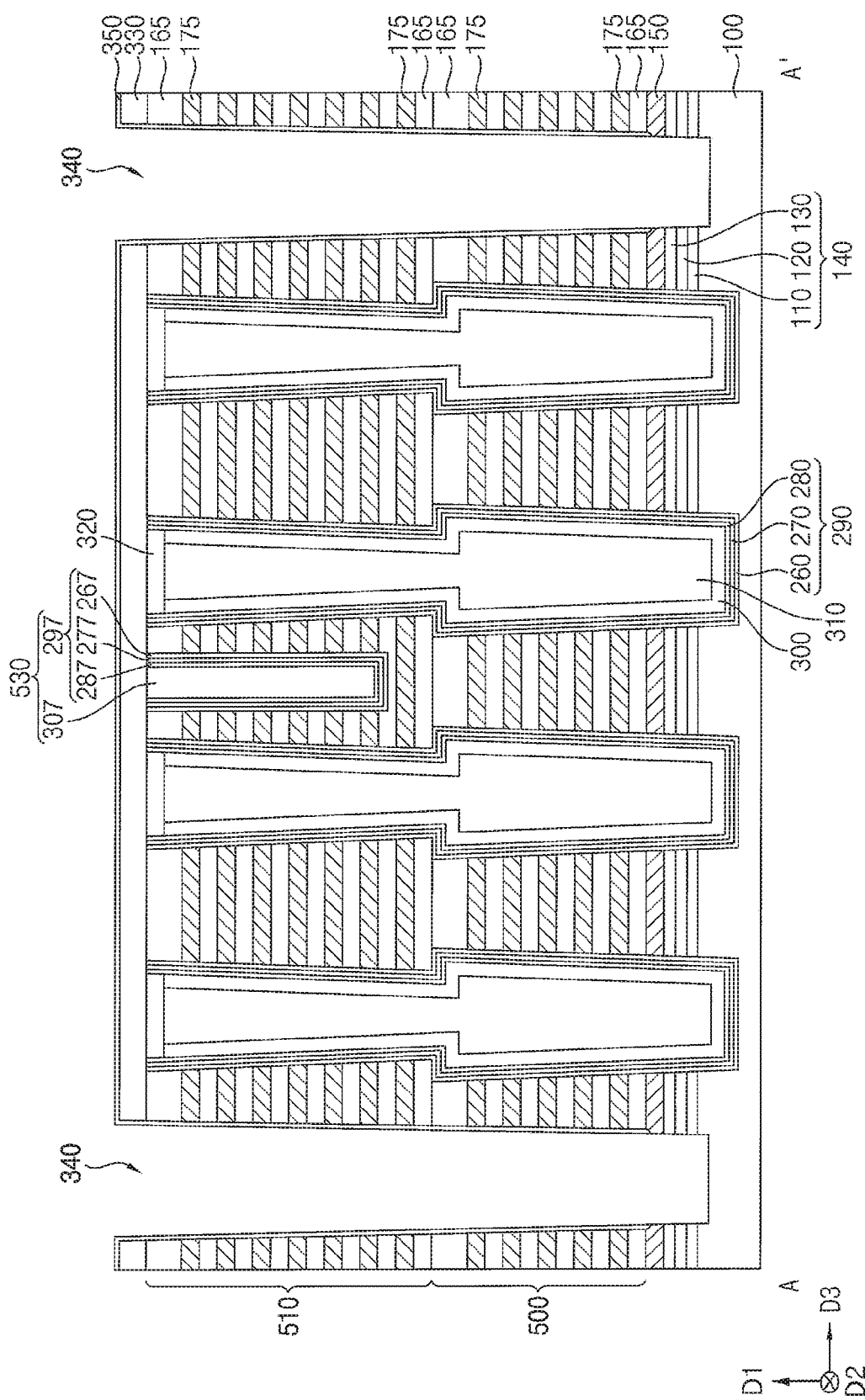

Referring to FIGS. 18 and 19, a first insulating interlayer 330 may be formed on the insulation layer 160, the first and second pads 320 and 325, the second dummy channel 307, the charge storage structure 290, and the first and second dummy charge storage structures 295 and 297, and a third opening 340 may be formed through the first insulating interlayer 330 and the first and second mold layers 500 and 510 on the substrate 100 by, e.g., a dry etching process.

The dry etching process may be performed until the third opening 340 exposes an upper surface of the support layer 150 or the support pattern, and further the third opening 340 may extend through an upper portion thereof. As the third opening 340 is formed, the insulation layers 160 and the fourth sacrificial layers 170 of the first and second mold layers 500 and 510 may be exposed by a sidewall of the third opening 340.

In example embodiments, the third opening 340 may extend in the second direction D2 on the substrate 100, and third openings 340 may be formed in the third direction D3. As the third opening 340 is formed, the insulation layer 160 may be divided into insulation patterns each of which may extend in the second direction D2, and the fourth sacrificial layer 170 may be divided into fourth sacrificial patterns 175 each of which may extend in the second direction D2.

A spacer layer may be formed on a sidewall and a bottom of the third opening 340 and an upper surface the first insulating interlayer 330, and a portion of the spacer layer on the bottom of the third opening 340 may be removed by an anisotropic etching process to form a spacer 350, and thus portions of the support layer 150 and the support pattern may be exposed.

The exposed portions of the support layer 150 and the support pattern, and a portion of the sacrificial layer structure 140 thereunder may be removed so as to enlarge the third opening 340 downwardly. Thus, the third opening 340 may expose an upper surface of the substrate 100, and further extend through an upper portion of the substrate 100.

In example embodiments, the spacer 350 may include undoped amorphous silicon or undoped polysilicon. If the spacer 350 includes undoped amorphous silicon, the spacer 350 may be crystallized by heat generated during deposition processes for other layers to include undoped polysilicon.

When the sacrificial layer structure 140 is partially removed, the sidewall of the third opening 340 may be covered by the spacer 350, and thus the insulation pattern 165 and the fourth sacrificial pattern 175 of the first and second mold layers 500 and 510 may not be removed.

Figure 20:
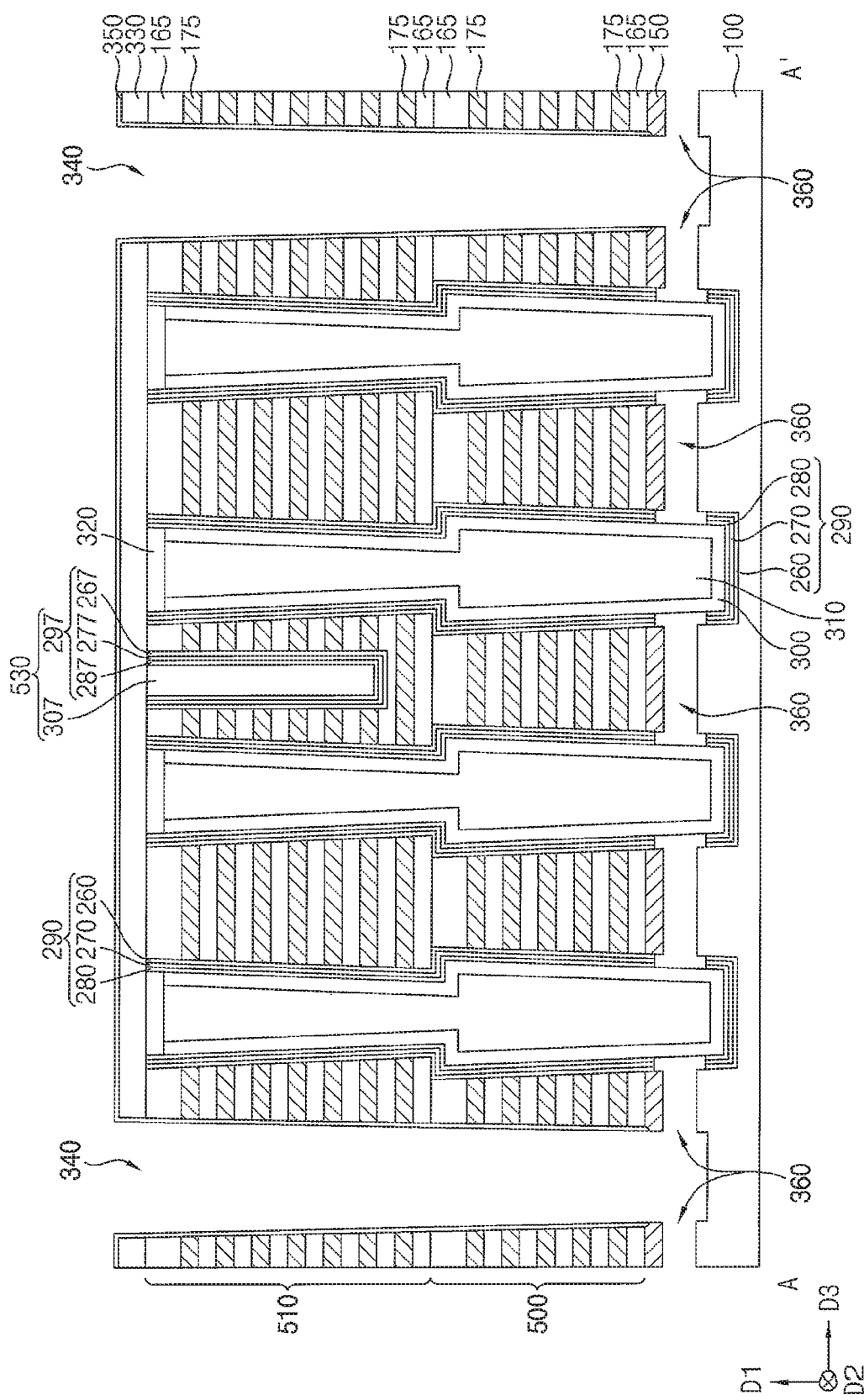

Referring to FIG. 20, the sacrificial layer structure 140 may be removed through the third opening 340 by, e.g., a wet etching process, so that a second gap 360 may be formed.

In example embodiments, the wet etching process may be performed using a solution including fluoric acid and/or phosphoric acid.

As the second gap 360 is formed, a lower surface of the support layer 150 and an upper surface of the substrate 100 adjacent the third opening 340 may be exposed. Additionally, sidewalls of portions of the charge storage structure 290 and the first dummy charge storage structure 295 may be exposed by the second gap 360, and the exposed portions of the charge storage structure 290 and the first dummy charge storage structure 295 may be also removed during the wet etching process to expose outer sidewalls of portions of the channel 300 and the first dummy channel 305. Thus, each of the charge storage structure 290 and the first dummy charge storage structure 295 may be divided into an upper portion extending through the first and second mold layers 500 and 510 to cover outer sidewalls of most portions of the channel 300 and the first dummy channel 305, and a lower portion covering lower surfaces of the channel 300 and the first dummy channel 305 on the substrate 100.

When the second gap 360 is formed by the wet etching process, the support layer 150 and the support pattern may not be removed, and thus the first and second mold layers 500 and 510 may not lean or fall down.

Figure 21:
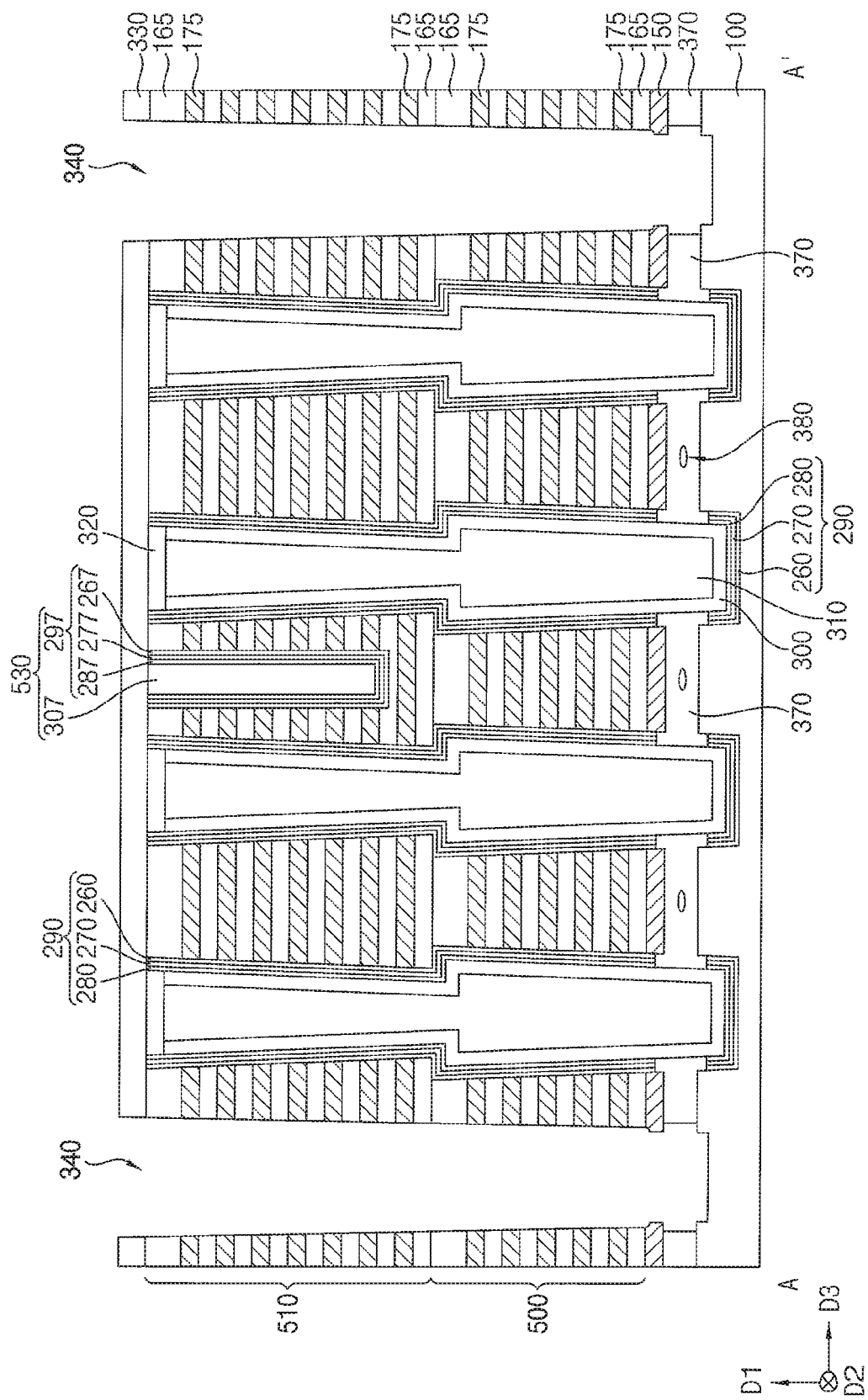

Referring to FIG. 21, the spacer 350 may be removed, a channel connection layer may be formed on the sidewall of the third opening 340 and in the second gap 360, and a portion of the channel connection layer in the third opening 340 may be removed by, e.g., an etch back process to form a channel connection pattern 370 in the second gap 360.

As the channel connection pattern 370 is formed, some ones of the channels 300 and the first dummy channels 305 between neighboring ones of the third openings 340 in the third direction D3 may be connected with each other.

The channel connection pattern 370 may include, e.g., amorphous silicon doped with N-type impurities, and may be crystallized by heat generated during deposition processes for other layers to include polysilicon doped with N-type impurities.

An air gap 380 may be formed in the channel connection pattern 370.

Figure 22:
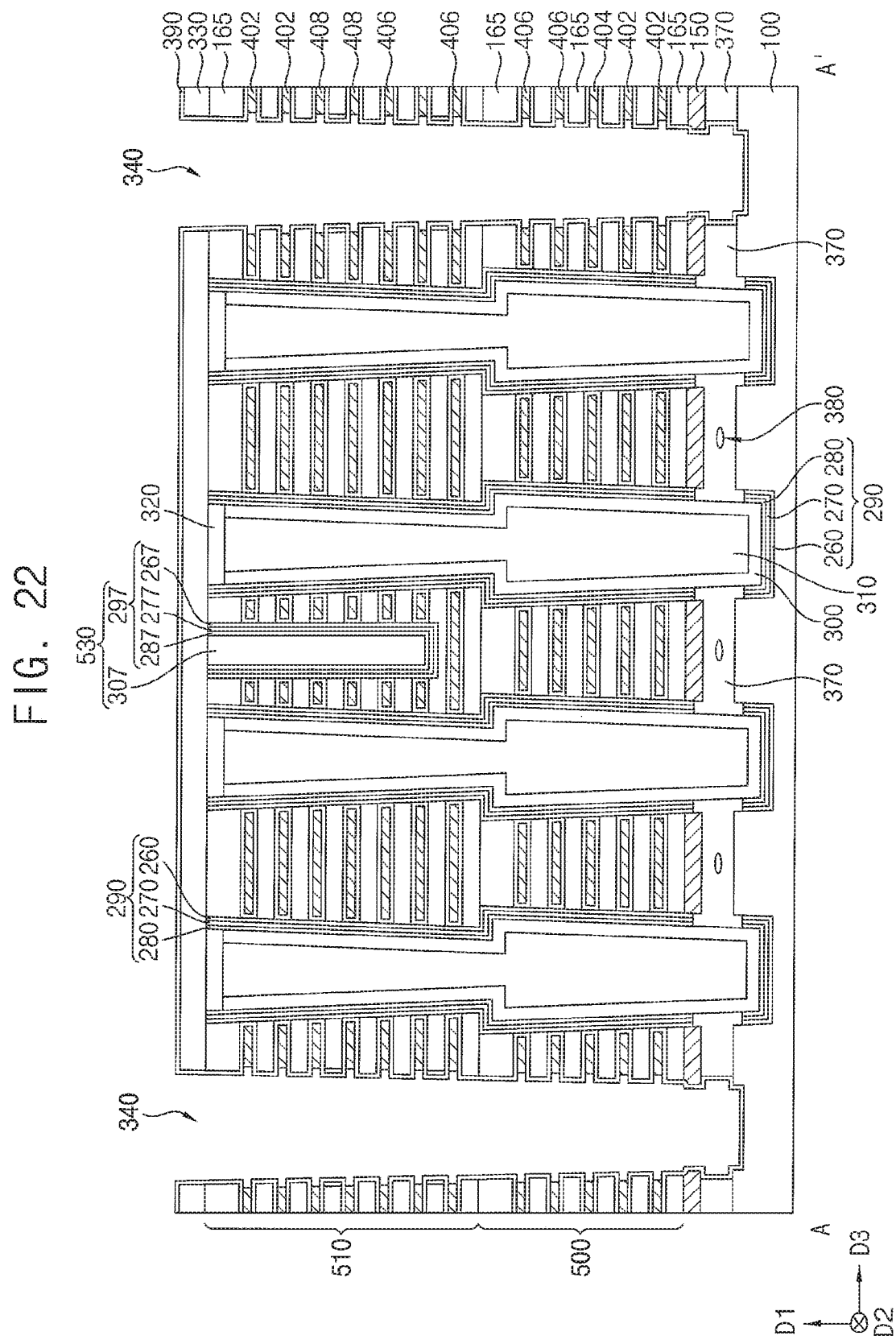

Referring to FIG. 22, the fourth sacrificial patterns 175 exposed by the third opening 340 may be removed to form a third gap between insulation patterns 165 at respectively levels, and outer sidewalls of portions of the first blocking pattern 260 and the first and second dummy blocking patterns 265 and 267 may be exposed by the third gap.

In example embodiments, the fourth sacrificial patterns 175 may be removed by a wet etching process using a solution including phosphoric acid or sulfuric acid.

A second blocking layer 390 may be formed on the exposed outer sidewalls of the portions of the first blocking pattern 260 and the first and second dummy blocking patterns 265 and 267, inner walls of the third gaps, surfaces of the insulation patterns 165, the sidewall and the lower surface of the support layer 150, the sidewall of the support pattern, a sidewall of the channel connection pattern 370, the upper surface of the substrate 100, and the upper surface of the first insulating interlayer 330, and a gate electrode layer may be formed on the second blocking layer 390.

In example embodiments, the second blocking layer 390 may include a metal oxide, e.g., aluminum oxide, hafnium oxide, zirconium oxide, etc. The gate electrode layer may include a gate conductive layer and a gate barrier layer covering lower and upper surfaces and a sidewall of the gate conductive layer. The gate conductive layer may include a low resistance metal, e.g., tungsten, titanium, tantalum, etc., and the gate barrier layer may include a metal nitride, e.g., titanium nitride, tantalum nitride, etc.

The gate electrode layer may be partially removed to form a gate electrode in each of the third gaps. In example embodiments, the gate electrode layer may be partially removed by a wet etching process.

In example embodiments, the gate electrode may extend in the second direction D2, and gate electrodes may be formed at different levels, respectively, spaced apart from each other in the first direction D1 to form a gate electrode structure. Gate electrode structures may be spaced apart from each other in the third direction D3 by the third opening 340. The gate electrode structure may include first, second, third and fourth gate electrodes 402, 404, 406 and 408 sequentially stacked in the first direction D1, and the first gate electrode 402 may be further stacked on the fourth gate electrode 408.

In example embodiments, the first gate electrode 402 may be used for body erase through gate induced drain leakage (GIDL) phenomenon, and may be formed at a lowermost level and a second level from below, and at an uppermost level and a second level from above. However, the inventive concept is not limited thereto, and the stack number of the first gate electrode 402 may be one or more than two.

The second gate electrode 404 may be formed over the first gate electrode 402 in the first mold layer 500, and may serve as a ground selection line (GSL). The fourth gate electrode 408 may be formed under the first gate electrode 402 in the second mold layer 510, and may serve as a string selection line (SSL). In illustrated embodiment, the second gate electrode 404 is formed at one level and the fourth gate electrode 408 is formed at two levels, respectively, however, the inventive concept is not limited thereto.

The third gate electrode 406 may be formed at different levels, respectively, between the second and fourth gate electrodes 404 and 408, and may serve as a word line. Some of the third gate electrodes 406 in each of the first and second mold layers 500 and 510 may serve as dummy word lines.

For example, as shown in the illustrated example, the third gate electrodes 406 at two levels, respectively, of the second mold layer 510, that is, at two levels under the fourth gate electrode 408 may serve as dummy word lines. Thus, the first gate electrodes 402, the fourth gate electrodes 408, and the dummy word lines among the third gate electrodes 406 in the second mold layer 510 may be divided in the third direction D3 by the second dummy charge storage structure 297 and the second dummy channel 307 extending in the second direction D2. However, the inventive concept is not limited thereto, and for example, the third gate electrodes 406 at three levels, respectively, under the fourth gate electrode 408 may serve as the dummy word lines.

Figure 23:
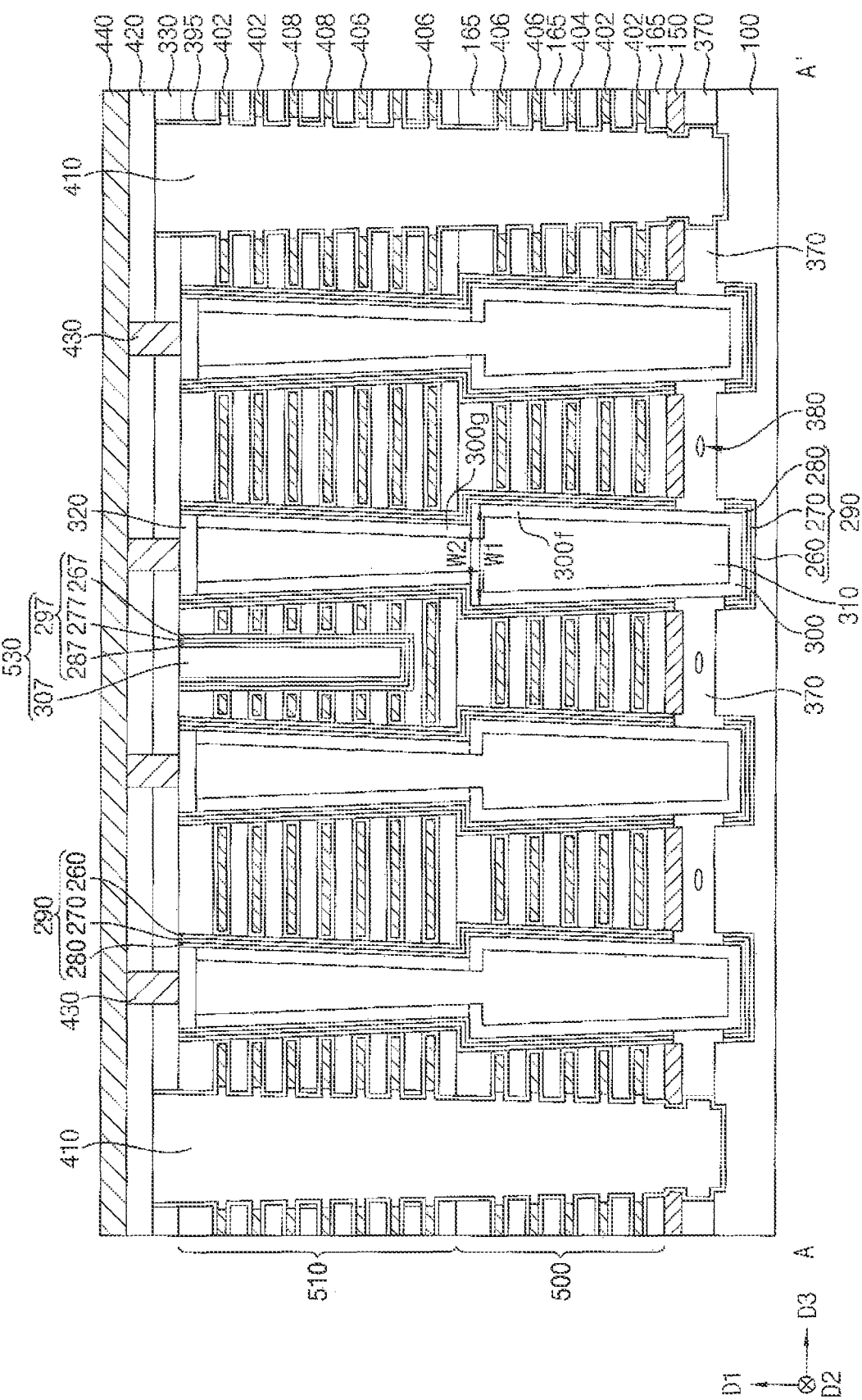
Figure 24:
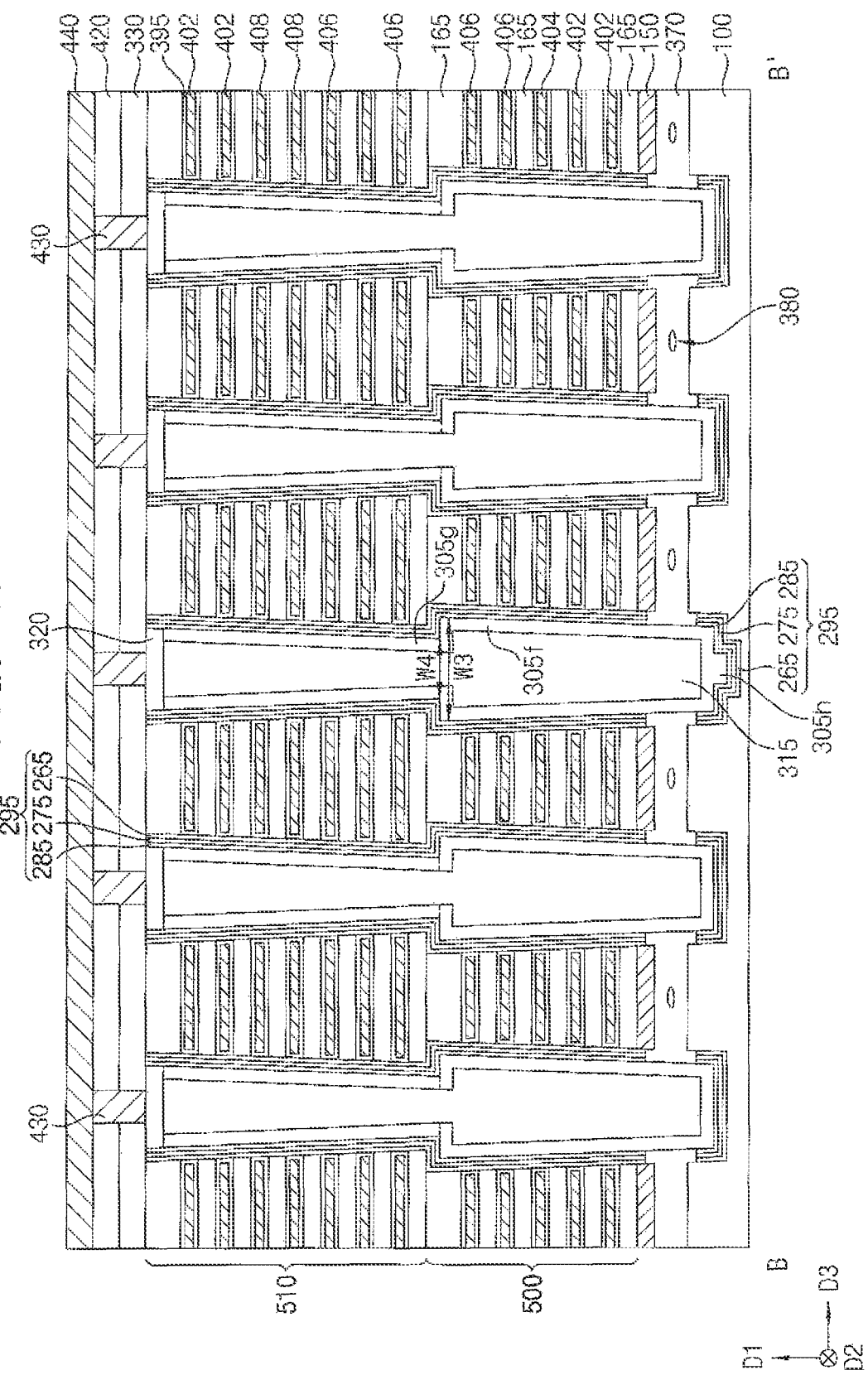

Referring to FIGS. 23 and 24, impurities may be implanted into an upper portion of the substrate 100 through a portion of the second blocking layer 390 on the bottom of the third opening 340 to form an impurity region (not shown). In example embodiments, the impurities may include N-type impurities, e.g., phosphorus, arsenic, etc.

A division layer may be formed on the second blocking layer 390 to fill a remaining portion of the third opening 340, and may be planarized until the upper surface of the first insulating interlayer 330 is exposed to form a second division pattern 410. During the planarization process, a portion of the second blocking layer 390 on the upper surface of the first insulating interlayer 330 may be removed, and a remaining portion of the second blocking layer 390 may be referred to as a second blocking pattern 395.

The second division pattern 410 may extend in the second direction D2, and second division patterns 410 may be formed in the third direction D3. The second division pattern 410 may include an oxide, e.g., silicon oxide.

After forming a second insulating interlayer 420 on the first insulating interlayer 330, the second division pattern 410, and the second blocking pattern 395, a contact plug 430 may be formed through the first and second insulating interlayers 330 and 420 to contact an upper surface of the first pad 320. A third insulating interlayer may be formed on the second insulating interlayer 420 and the contact plug 430, and a bit line 440 may be formed through the third insulating interlayer to contact an upper surface of the contact plug 430.

In example embodiments, the bit line 440 may extend in the third direction D3, and bit lines 440 may be formed in the second direction D2.

The vertical memory device may be manufactured by the above processes.

As illustrated above, after forming the upper channel holes 200 through an upper portion of the second mold layer 510 on the first mold layer 500 including the fifth sacrificial patterns 190 in the respective lower channel holes 180, the second opening 240 extending in the second direction D2 may be formed to be aligned with the upper channel holes 200. Thus, when compared to the case in which the second opening 240 is formed in the second mold layer 510 to be aligned with the lower channel holes 180 in the first mold layer 500 and the upper channel holes 200 are formed through the second mold layer 510, the second opening 240 may be directly aligned with the upper channel holes 200 so that the misalignment of the second opening 240 with the upper channel holes 200 may be reduced.

Additionally, instead of forming the charge storage structure and the channel to fill the lower and upper channel holes after forming the first division pattern in the second opening 240, the charge storage structure layer, the channel layer and the filling layer may be simultaneously formed to fill the lower and upper channel holes 180 and 200 and the second opening 240, so that the number of manufacturing processes, as well as the overall cost of the manufacturing process may be reduced.

Certain examples of a vertical memory device according to embodiments of the inventive concept may include one or more of the following structural characteristics.

Referring to FIGS. 18, 22 and 23, the vertical memory device may include the gate electrode structure having the gate electrodes 402, 404, 406 and 408 spaced apart from each other in the first direction D1. The channels 300 extending through the gate electrode structure and having a first portion 300f on the substrate 100 and a second portion 300g on and contacting the first portion 300f, which may include a lower surface having a second width W2 less than a first width W1 of an upper surface of the first portion 300f.

The charge storage structure covering an outer sidewall of a corresponding one of the channels 300, the first dummy channel 305 extending through the gate electrode structure and having a third portion 305f on the substrate 100 and a fourth portion 305g on and contacting the third portion 305f, which may include a lower surface having a fourth width W4 less than a third width W3 of an upper surface of the third portion 305a. The first dummy charge storage structure 295 covers an outer sidewall of the first dummy channel 305, wherein the first division pattern 530 extending in the second direction D2 between the channels 300 and including the second dummy channel 307 and the second dummy charge storage structure 297 covers a sidewall and a bottom of the second dummy channel 307. And the contact plugs 430 on the channels 300, respectively, and the bit line 440 extending in the third direction D3 are electrically connected to the contact plugs 430.

In example embodiments, each of the first and second dummy channels 305 and 307 may include a material substantially the same as that of the channels 300, e.g., polysilicon, and each of the first and second dummy charge storage structures 295 and 297 may include a material substantially the same as that of the charge storage structure 290. Each of the charge storage structure 290 and the first and second dummy charge storage structures 295 and 297 may include a silicon oxide layer, a silicon nitride layer and a silicon oxide layer sequentially stacked.

In example embodiments, the second dummy channel 307 may contact an upper outer sidewall of the first dummy channel 305, and the second dummy charge storage structure 297 may contact an upper outer sidewall of the first dummy charge storage structure 295.

In example embodiments, first dummy channels 305 may be spaced apart from each other in the second direction D2, and first dummy charge storage structures 295 may be also spaced apart from each other in the second direction D2. The second dummy channel 307 may extend in the second direction D2 between the first dummy channels 305, and the second dummy charge storage structure 297 may extend in the second direction D2 between the first dummy charge storage structures 295.

In example embodiments, each of the channels 300 and the first dummy channel 305 may have a cup-like shape, and the first filling pattern 310 may be formed in a space formed by an inner wall of each of the channels 300 and the second filling pattern 315 may be formed in a spaced apart from each other formed by an inner wall of the first dummy channel 305.

In example embodiments, a width in the third direction D3 of the first division pattern 530 may be less than a width in the third direction D3 of a structure including each of the channels 300, the charge storage structure 290 covering the outer sidewall thereof, and the first filling pattern 310 contacting an inner wall of the charge storage structure, and thus the second dummy channel 307 included in the first division pattern 530 may have a pillar shape instead of a cup-like shape.

In example embodiments, the first dummy channel 305 may include a protrusion portion 305h protruding toward the substrate 100 in the first direction D1 downwardly, and thus a lowermost surface of the first dummy channel 305 may be lower than a lowermost surface of each of the channels 300. That is, each of the channels 300 may have a flat lower surface, while the first dummy channel 305 may have a non-flat lower surface due to the protrusion portion 305c, and thus the lowermost surface of the first dummy channel 305 may be lower than that of each of the channels 300.

In example embodiments, the charge storage structure 290 may include an upper portion covering an outer sidewall of the channel 300 and a lower portion spaced apart from the upper portion and covering a lower surface of the channel 300. The first dummy charge storage structure 295 may include an upper portion covering an outer sidewall of the first dummy channel 305 and a lower portion spaced apart from the upper portion and covering a lower surface of the first dummy channel 305. As the first dummy channel 305 includes the protrusion portion 305c, a lowermost surface of the lower portion of the first dummy charge storage structure 295 covering the lower surface of the first dummy channel 305 may be lower than that of the charge storage structure 290 covering the lower surface of the channel 300.

In example embodiments, unlike the channel 300, no contact plug may be formed on the first dummy channel 305, and thus no electrical signal may be applied to the first dummy channel 305.

While example embodiments have been particularly shown and described, it will be understood by one of ordinary skill in the art that variations in form and detail may be made therein without departing from the spirit and scope of the inventive concept as defined by the following claims.

What is claimed is:

1. A vertical memory device comprising:
   a gate electrode structure on a substrate and including gate electrodes spaced apart in a first direction;
   channels extending through the gate electrode structure and including a first portion on the substrate and a second portion contacting the first portion, wherein the second portion includes a lower surface having a width less than a width of an upper surface of the first portion;
   a charge storage structure covering an outer sidewall of each of the channels;
   a first dummy channel extending through the gate electrode structure and spaced apart from the channels, wherein the first dummy channel includes a third portion on the substrate and a fourth portion contacting the third portion and the fourth portion includes a lower surface having a width less than a width of an upper surface of the third portion; and
   a division pattern extending between the channels in a second direction, wherein the division pattern includes a second dummy channel and a second dummy charge storage structure covering a sidewall and a lower surface of the second dummy channel, wherein:
   the second dummy channel contacts an upper outer sidewall of the fourth portion of the first dummy channel,
   the second dummy channel includes a material substantially the same as each of the channels, and
   the second dummy charge storage structure includes a material substantially the same as the charge storage structure.

2. The vertical memory device of claim 1, wherein:
   each of the channels and the second dummy channel includes polysilicon, and
   each of the charge storage structure and the second dummy charge storage structure includes a silicon oxide layer, a silicon nitride layer, and a silicon oxide layer sequentially stacked.

3. The vertical memory device of claim 1, wherein:
   each of the channels has a cup-like shape and the second dummy channel has a pillar shape, and
   the vertical memory device further comprises a first filling pattern in a space formed by an inner wall of each of the channels and contacting an inner wall of the charge storage structure.

4. The vertical memory device of claim 3, wherein a width in a third direction of the division pattern is less than a width in the third direction of a structure including each of the channels.

5. The vertical memory device of claim 1, wherein:
   a first dummy charge storage structure covers an outer sidewall of the first dummy channel, and
   the second dummy charge storage structure contacts an upper sidewall of the first dummy charge storage structure.

6. The vertical memory device of claim 5, wherein:
   the first dummy channel is one of first dummy channels spaced apart in the second direction, and
   the second dummy charge storage structure is one of second dummy charge storage structures spaced apart in the second direction, and
   the second dummy channel extends in the second direction between the first dummy channels, and
   the second dummy charge storage structure extends in the second direction between the first dummy charge storage structures.

7. The vertical memory device of claim 5, wherein a lowermost surface of the third portion of the first dummy channel is lower than a lowermost surface of one of the channels.

8. The vertical memory device of claim 5, wherein:
   the charge storage structure includes an upper portion and a lower portion, the upper portion covers an outer sidewall of the one of the channels, and the lower portion covers a lower surface of the one of the channels,
   the first dummy charge storage structure includes an upper portion and a lower portion, the upper portion covers an outer sidewall of the first dummy channel, and the lower portion covers a lower surface of the first dummy channel, and
   a lowermost surface of the third portion of the first dummy charge storage structure is lower than a lowermost surface of the charge storage structure.

9. The vertical memory device of claim 5, wherein:
   the first dummy channel has a cup-like shape, and
   the vertical memory device further comprises a first filling pattern in a space formed by an inner wall of the first dummy channel, and
   the second filling pattern includes a material substantially the same as the first filling pattern.

10. The vertical memory device of claim 5, further comprising:
    contact plugs on the channels, respectively; and
    a bit line extending in a third direction and electrically connected to the contact plugs, wherein
    no contact plug is formed on the first dummy channel such that no electrical signal is applied to the first dummy channel.

11. A vertical memory device comprising:
    a gate electrode structure on a substrate and including gate electrodes spaced apart in a first direction;
    channels extending through the gate electrode structure and including a first portion on the substrate and a second portion contacting the first portion, wherein the second portion includes a lower surface having a width less than a width of an upper surface of the first portion;
    a first dummy channel extending through the gate electrode structure and spaced apart from the channels, wherein the first dummy channel includes a third portion on the substrate and a fourth portion contacting the third portion and the fourth portion includes a lower surface having a width less than a width of an upper surface of the third portion; and a division pattern extending in a second direction between the channels and including a second dummy channel and a second dummy charge storage structure covering a sidewall and a lower surface of the second dummy channel, wherein:

the first dummy channel includes a material substantially the same as each of the channels, the first dummy channel includes a protrusion portion protruding in the first direction from a lower surface of the third portion and a lowermost surface is lower than a lowermost surface of each of the channels, and the second dummy channel contacts an upper outer sidewall of the first dummy channel.

12. The vertical memory device of claim 11, further comprising:

a charge storage structure covering an outer sidewall of each of the channels; and a first dummy charge storage structure covering an outer sidewall of the first dummy channel, wherein the charge storage structure includes a material substantially the same as the first dummy charge storage structure.

13. The vertical memory device of claim 12, wherein:

the charge storage structure includes an upper portion and a lower portion, the upper portion covering an outer sidewall of the channel, and the lower portion covering a lower surface of the channel, the first dummy charge storage structure includes an upper portion and a lower portion, the upper portion covering an outer sidewall of the first dummy channel, and the lower portion covering a lower surface of the first dummy channel, and a lowermost surface of the first dummy charge storage structure is lower than a lowermost surface of the charge storage structure.

14. The vertical memory device of claim 12, wherein the second dummy channel contacts an upper outer sidewall of the first dummy charge storage structure, and the second dummy channel includes a material substantially the same as the channels, and the second dummy charge storage structure includes a material substantially the same as the charge storage structure.

15. The vertical memory device of claim 14, wherein:

the first dummy channel is one of first dummy channels spaced apart in the second direction and the first dummy charge storage structure is one of first dummy charge storage structures spaced apart in the second direction, and the second dummy channel extends in the second direction between the first dummy channels, and the second dummy charge storage structure extends in the second direction between the first dummy charge storage structures.

16. The vertical memory device of claim 14, wherein:

each of the channels, the first dummy channel, and the second dummy channel includes polysilicon, and each of the charge storage structure, the first dummy charge storage structure and the second dummy charge storage structure includes a silicon oxide layer, a silicon nitride layer, and a silicon oxide layer sequentially stacked.

17. The vertical memory device of claim 14, wherein:

each of the channels and the first dummy channel has a cup-like shape and the second dummy channel has a pillar shape, and the vertical memory device further comprises a first filling pattern in a space formed by an inner wall of each of the channels and a second filling pattern in a space formed by an inner wall of the first dummy channel.

18. A vertical memory device comprising:

a gate electrode structure on a substrate and including gate electrodes spaced apart in a first direction;

channels extending through the gate electrode structure and including a first portion on the substrate and a second portion contacting the first portion and the second portion includes a lower surface having a width less than a width of an upper surface of the first portion;

a charge storage structure covering an outer sidewall of each of the channels;

a first dummy channel extending through the gate electrode structure and spaced apart from the channels, wherein the first dummy channel includes a third portion on the substrate and a fourth portion contacting the third portion and the fourth portion includes a lower surface having a width less than a width of an upper surface of the third portion;

a first dummy charge storage structure covering an outer sidewall of the first dummy channel;

a division pattern extending between the channels in a second direction and including a second dummy channel;

a second dummy charge storage structure covering a sidewall and a lower surface of the second dummy channel;

contact plugs respectively on the channels; and a bit line extending in a third direction and electrically connected to the contact plugs, wherein:

each of the first dummy channel and the second dummy channel includes a material substantially the same as the channels, each of the first dummy charge storage structure and the second dummy charge storage structure includes a material substantially the same as the charge storage structure, the second dummy channel contacts an upper outer sidewall of the first dummy channel, and the second dummy charge storage structure contacts an upper outer sidewall of the first dummy charge storage structure.

19. The vertical memory device of claim 18, wherein:

each of the channels, the first dummy channel, and the second dummy channel includes polysilicon, and each of the charge storage structure, the first dummy charge storage structure and the second dummy charge storage structure includes a silicon oxide layer, a silicon nitride layer, and a silicon oxide layer sequentially stacked.

20. The vertical memory device of claim 18, wherein:

the first dummy channel is one of first dummy channels spaced apart in the second direction and the first dummy charge storage structure is one of first dummy charge storage structures spaced apart in the second direction, the second dummy channel extends in the second direction between the first dummy channels, and the second dummy charge storage structure extends in the second direction between the first dummy charge storage structures.

* * * * *